(12) United States Patent
Maeno

(10) Patent No.: US 6,400,292 B1
(45) Date of Patent: Jun. 4, 2002

(54) SEMICONDUCTOR INTEGRATED CIRCUIT DEVICE

(75) Inventor: Hideshi Maeno, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/847,410

(22) Filed: May 3, 2001

(30) Foreign Application Priority Data

Sep. 18, 2000 (JP) ........................................ 2000-282422

(51) Int. Cl.[7] .............................................. H03M 9/00
(52) U.S. Cl. ........................................ 341/101; 341/100
(58) Field of Search ................................ 341/101, 100; 326/9; 365/200; 714/781

(56) References Cited

U.S. PATENT DOCUMENTS 3,798,597 A * 3/1974 Frambs et al. .............. 714/781
4,151,510 A   4/1979 Howell et al.
4,954,826 A * 9/1990 Isozaki et al. .............. 341/100
5,859,801 A * 1/1999 Poechmueller .............. 365/200

FOREIGN PATENT DOCUMENTS

JP          5-82000          11/1993

* cited by examiner

Primary Examiner—Peguy JeanPierre
Assistant Examiner—Jean Bruner JeanGlaude
(74) Attorney, Agent, or Firm—Burns, Doane, Swecker & Mathis, LLP

(57) ABSTRACT

A semiconductor integrated circuit device has a redundancy circuit such that when a parallel/serial conversion circuit converts the separation information of a program element group such as one fuse element group to serial data, the serial data is transmitted through a serial/parallel conversion circuit, thus controlling circuits to be controlled such as a plurality of RAMs. Further by introducing a CRC technique in the parallel/serial conversion circuit, even when there is an error input such as cutting error of the fuse element, the information may be reproduced.

7 Claims, 20 Drawing Sheets

FIG.10
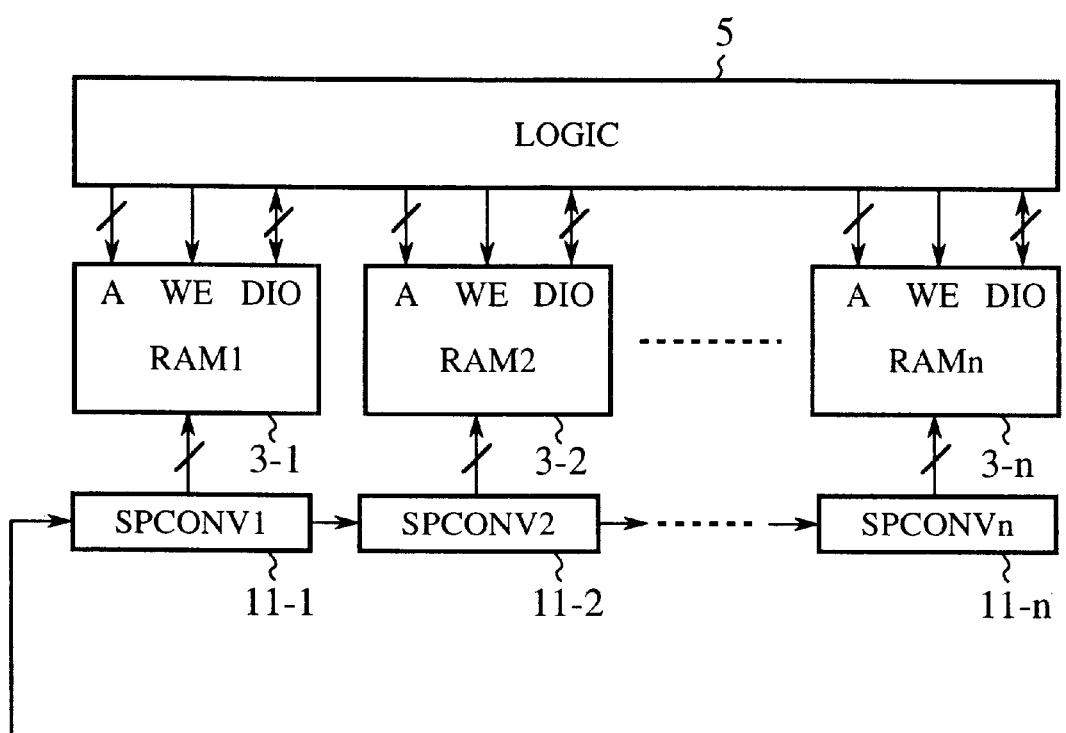
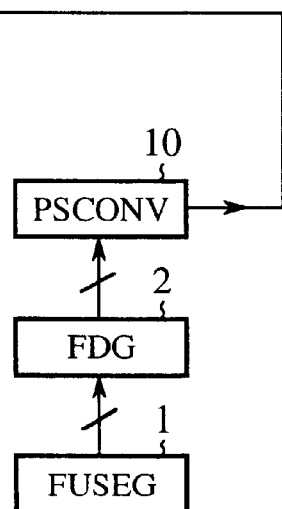

SEMICONDUCTOR INTEGRATED CIRCUIT DEVICE

BACKGROUND OF THE INVENTION

1. Field of the Invention

The present invention relates to a semiconductor integrated circuit device having a program element such as a fuse.

2. Description of Related Art

FIG. 18 is a schematic circuit diagram of a conventional semiconductor integrated circuit device having a fuse element. In FIG. 18, reference numeral 101 designates a fuse element group (FUSEG); 102 designates a fuse state detection circuit group (FDG) for detecting the ON/OFF state of fuse elements; 103 designates a random access memory or RAM; 1031 designates a main memory access array (MMCA); 1032 designates a redundancy memory cell array for columns (RMCAC); and 1033 designates a redundancy memory cell array for rows (RMCAR). Reference symbols F0–F3 each denote a fuse element; and FD denotes a fuse state detection circuit.

Here, the fuse elements F0, F1, F2, and F3 in the fuse state detection circuit group 101 can be cut or shorted according to information to be programmed by current, laser beam, voltage, and so on. Though only the four fuses are depicted in FIG. 18, a real semiconductor integrated circuit device is constructed by containing more than four fuses.

On the other hand, each fuse state detection circuit FD in the fuse state detection circuit group 102 detects the ON/OFF state of whether the corresponding fuse is cut or not, and then outputs "1" or "0" as a logic signal. The fuse state detection circuit group 102 outputs the information of a plurality of bits.

As to the RAM 103, in FIG. 18, reference symbol A denotes an address terminal; WE denotes a write enable terminal; and DIO denotes a data input/output terminal, which may be replaced by a terminal provided with an data input terminal and a data output terminal discretely. In response to information output from the fuse state detection circuit group 102, the RAM 103 can replace part of the main memory cell array 1031 with the corresponding part of the redundancy memory cell array for columns 1032 or the redundancy memory cell array for rows 1033. Such a function is utilized for the correction or relief of a defective memory cell of the main memory cell array.

The redundancy memory cell array for columns 1032 is applied for the correction of a bit line fault and an in-cell fault, while the redundancy memory cell array for rows 1033 is applied for the correction of a word line fault and an in-cell fault.

Next, FIG. 19 is another schematic circuit diagram of a conventional semiconductor integrated circuit device having a fuse element. In FIG. 19, reference numeral 104 designates an (Error Checking and Correcting) error correction circuit which detects an error in a data transmission of ECC code and corrects the corresponding error point. The ECC is explained as follows: In order to detect an error and further correct this, bits for error detection or correction based on a certain rule are added to original data. Note that the same other numerals above denote the same or corresponding parts.

The semiconductor integrated circuit device as shown in FIG. 19, in addition to the circuit configuration of FIG. 18, is further added the ECC error correction circuit 104 to the fuse section, thus improving the yield of the semiconductor integrated circuit device. In this example, three bits for checking of F4, F5 and F6 is added to four information bits of F0, F1, F2 and F3. That error correction method is disclosed in JP-B-5/82000.

Further, FIG. 20 is yet another schematic circuit diagram of a conventional semiconductor integrated circuit device, which disposes a plurality of RAMs having a fuse element as shown in FIGS. 18 and 19. In FIG. 20, reference numerals 101-1 to 101-n (n: natural number) each designate a fuse element group; 102-1 to 102-n each designate a fuse state detection circuit group; 103-1 to 103-n each designate a RAM; and 105 designates a random logic circuit, which carries out a control and data input/output for the RAMs 103-1 to 103-n.

For this reason, the circuit configuration of FIG. 20 requires a plurality of circuit compositions corresponding to n out of the fuse element groups 101-1 to 101-n, fuse state detection circuit groups 102-1 to 102-n, RAMs 103-1 to 103-n, and ECC error correction circuits 104-1 to 104-n. Note that the ECC error correction circuits 104-1 to 104-n are eliminated if not required.

FIGS. 21A and 21B are examples of circuit diagrams illustrating CRC (Cyclic Redundancy Code) circuits which correspond to conventional error correction techniques. FIG. 21A illustrates a CRC generation circuit, and FIG. 21B illustrates a CRC correction circuit. In FIGS. 21A and 21B, reference symbols G1 to G3, D1 to D3, and S0 to S6 each denote a flip-flop (FF).

These examples correspond to the CRC circuits of a characteristic polynominal: $G(x)=1+X+X^3$. The CRC generation circuit of FIG. 21A adds check bits of 3 bits to information bits of 4 bits, while the CRC correction circuit of FIG. 21B input a CRC of 7 bits and corrects an error of 1 bit and can correct the error of 1 bit at any position in the 7 bits. However, the error of 2 bits or more cannot be corrected.

Hereinafter, the operation of the aforementioned circuits will be described briefly.

(1) As to Generation Operation of CRC (Referring to FIG. 21A):

(1-1) Reset the flip-flops G1, G2, and G3 (reset means not depicted).

(1-2) In a state that the signal input of SELSIG terminal is SELSIG=1, a clock is provided for the flip-flops G1, G2, and G3 while the information bits of 4 bits to SIG terminal is inputted in series. At this time, the information bits of 4 bits is transferred at SEG terminal as it stands, and simultaneously the data of the check bits is generated in the flip-flops G1, G2, and G3.

(1-3) In a state that the signal input of SELSIG terminal is SELSIG=0, the data of the flip-flops G3, G2, and G1 are outputted to SOG terminal in series.

On the basis of the above operation, the CRC of 7 bits (4 bits+3 bits) is outputted from the SOG output terminal.

(2) As to Error Correction Operation of CRC (Referring to FIG. 21B):

(2-1) Reset the D1, D2, and D3 to "0" (reset means not depicted).

(2-2) clocks are supplied0 for the flip-flops D1 to D3 and S0 to S6 while the CRC of 7 bits are inputted in series from SIC terminal. Here, at the moment time the CRC of 7 bits is stored in the flip-flops S0 to S6, error detection results of the flip-flop S0 to the bits are outputted from COR output ("1" is outputted when an error exists). Accordingly, in SOC terminal, error corrected data is outputted to the bit of the flip-flop S0.

In FIGS. 9 and 11, the fuses F4 to F6 and flip-flops S4 to S6 are assigned to the check bits, while the fuses F0 to F3 and flip-flops S0 to S3 are assigned to the information bits. However, it is possible to change such an assignment. For example, the following is considered: the fuses F0 to F2 and flip-flops S0 to S2 are assigned to the check bits, while the fuses F3 to F6 and flip-flops S3 to S6 are assigned. In this case, the circuit must be changed to construct a counter with the flip-flops S3 to S6, but not depicted since it is inferred with ease.

(2-3) In a state that the signal input of SIC terminal is SIC=0, clocks are supplied for the flip-flops D1 to D3. Thus, an error detection result corresponding to the bit of the flip-flop S0 is outputted to the COR output ("1" is outputted when an error exists). Accordingly, in SOC terminal, error corrected data is outputted to the bit of the flip-flop S0.

(2-4) In a state that the signal input of SIC terminal is SIC=0, when clocks according to 6 cycles are supplied for the flip-flops D1 to D3 and S0 to S6, error corrected data is outputted in series from SOC terminal with respect to the remaining 6 bits.

However, when only the information bits of 4 bits are required, it is reasonable to perform the error correction operation for only the front 4 bits. Accordingly, the error correction operation of the subsequent check bits of 3 bits is not required.

As described above, in the digital communication, the error correction technique which enables an error correction of 1 bit has been gone into actual use by the CRC technique.

Since the conventional semiconductor integrated circuit device is constructed in the circuit as described above, as shown in FIG. 20, the corresponding plural sets of the fuse element groups 101-1 to 101-n, fuse state detection circuit groups 102-1 to 102-n, and ECC error correction circuits 104-1 to 104-n are required, resulting in an area increase of the semiconductor integrated circuit device and increasing the production cost.

SUMMARY OF THE INVENTION

The present invention is implemented to solve the foregoing drawbacks. It is therefor an object of the present invention to provide a semiconductor integrated circuit device which controls an area increase related to a program element, improving the production yield, and further reducing the production cost.

A semiconductor integrated circuit device according to the present invention is characterized in that when a parallel/serial conversion circuit converts the separation information of a program element group such as one fuse element group to serial data, the serial data is transmitted through a serial/parallel conversion circuit, thus controlling circuits to be controlled such as a plurality of RAMS. Further, it is characterized by introducing a CRC technique in the parallel/serial conversion circuit, even when there is an error input such as separation error of the fuse element, the information may be reproduced.

More specifically, according to a first aspect of the present invention, there is provided a semiconductor integrated circuit device comprising: a plurality of circuits to be controlled; a plurality of program elements; a program state detection circuit group for converting program states of said program elements to a plurality of logic signals; a parallel/serial conversion circuit for converting the logic signals outputted from said program state detection circuit group to serial data; and one or a plurality of serial/parallel conversion circuits for receiving and supplying said serial data.

Here, said parallel/serial conversion circuit may include a CRC error correction circuit.

The parallel/serial conversion circuit may include a counter circuit capable of setting part of all of parallel input data as a primary value; and a specific state detection circuit for detecting a specific state of said counter circuit, thereby transmitting the output of said specific state detection circuit to said serial/parallel conversion circuit as serial data.

The program element may be a fuse element to be fused.

One of said circuits to be controlled may be a memory circuit having a redundancy memory cell array, a power supply circuit, or a timing generation circuit.

BRIEF DESCRIPTION OF THE DRAWINGS

FIG. 10 is a schematic circuit diagram of a semiconductor integrated circuit device in accordance with an embodiment 10 of the present invention;

DETAILED DESCRIPTION OF THE PREFERRED EMBODIMENTS

An embodiment of the present invention will be described below.

Embodiment 1

Figure 1:
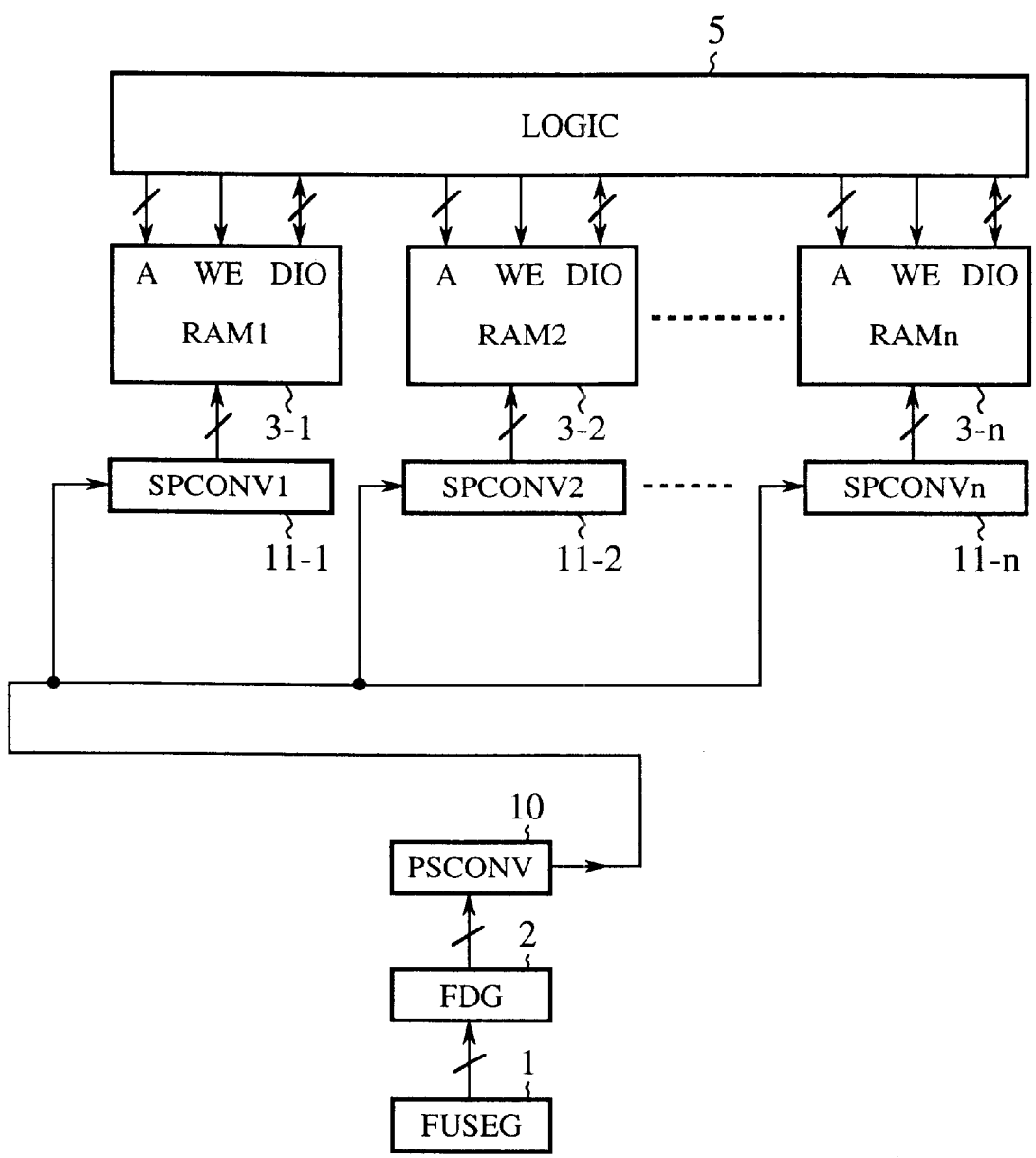
FIG. 1 is schematic circuit diagram of a semiconductor integrated circuit device in accordance with an embodiment 1 of the present invention.

FIG. 1 is a schematic circuit diagram of a semiconductor integrated circuit device in accordance with an embodiment 1 of the present invention. In FIG. 1, reference numeral 1 designates a fuse element group (FUSEG)(program element); 2 designates a fuse state detection circuit group (FDG) (program state detection circuit group), 5 designates a logic (LOGIC); 10 designates a parallel/serial conversion circuit (PSCONV); 11-1 to 11-n (n: natural number) each designate a serial/parallel conversion circuit (SPCONV); and 3-1 to 3-n each designate a random access memory or RAM (circuit to be controlled, memory circuit). The serial/parallel conversion circuits 11-1 to 11-n are provided for the RAMs 3-1 to 3-n, respectively, to convert serial data to parallel data, and the number of bits in each serial/parallel conversion circuit may differ. The RAMs 3-1 to 3-n may differ in the number of each of word lines, data input/output terminals, and so on.

The configuration of the RAM 3-i (i=1 to n), which is an arbitrary one among the RAMs 3-1 to 3-n, will be described below with reference to FIG. 2.

Figure 2:
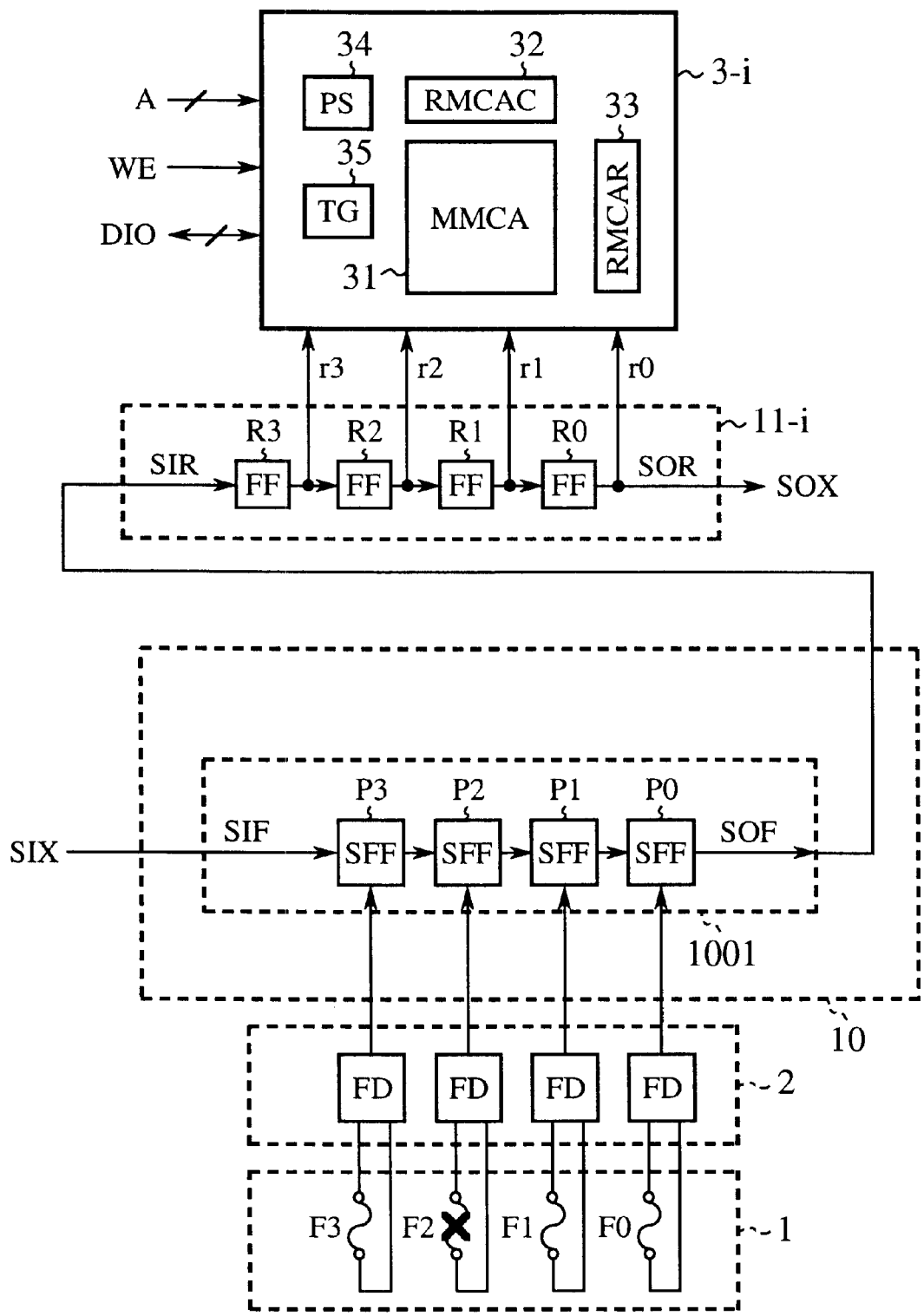
FIG. 2 is a circuit diagram of a semiconductor integrated circuit device in accordance with an embodiment 2 of the present invention.

In FIG. 2, reference symbol A denotes an address terminal; WE denotes a write enable terminal; DIO denotes a data input/output terminal; reference numeral 31 designates a main memory cell array (MMCA); 32 designates a redundancy memory cell array for columns (RMCAC); 33 designates a redundancy memory cell array for rows (RMCAR); 34 designates an internal RAM power supply circuit; and 35 designates a timing-generation circuit (TG).

The timing generation circuit 35 and power supply circuit 34 can be controlled corresponding to the separation information of the fuse element group 1, and is used to compensate the variations of internal timings and internal voltages caused by the dispersion in fabrication processes. Off course, when the redundancy memory cell array exists, the remedy or saving of failures can be implemented on the basis of the separation information of the fuse element group 1.

Next, the operation will be described below.

For example, when a failure exists in an arbitrary RAM 3-i, the fuse elements F0 to F3 included in the fuse element group 1 are programmed so as to replace part of the main memory cell array 31 with the redundancy memory cell array for columns 32 or redundancy memory cell array for rows 33. Since the separation information of the fuse element group 1 is also converted to series data and transmitted to the other RAMs 3-1 to 3-k (k=1 to n, except for RAM 3-i), part of the main memory cell array 31 may be replaced with the redundancy memory arrays 32 and 33 in the RAM 3-k as well. However, when there is no faults in the redundancy memory cell arrays 32 and 33, no troubles occur.

Figure 20:
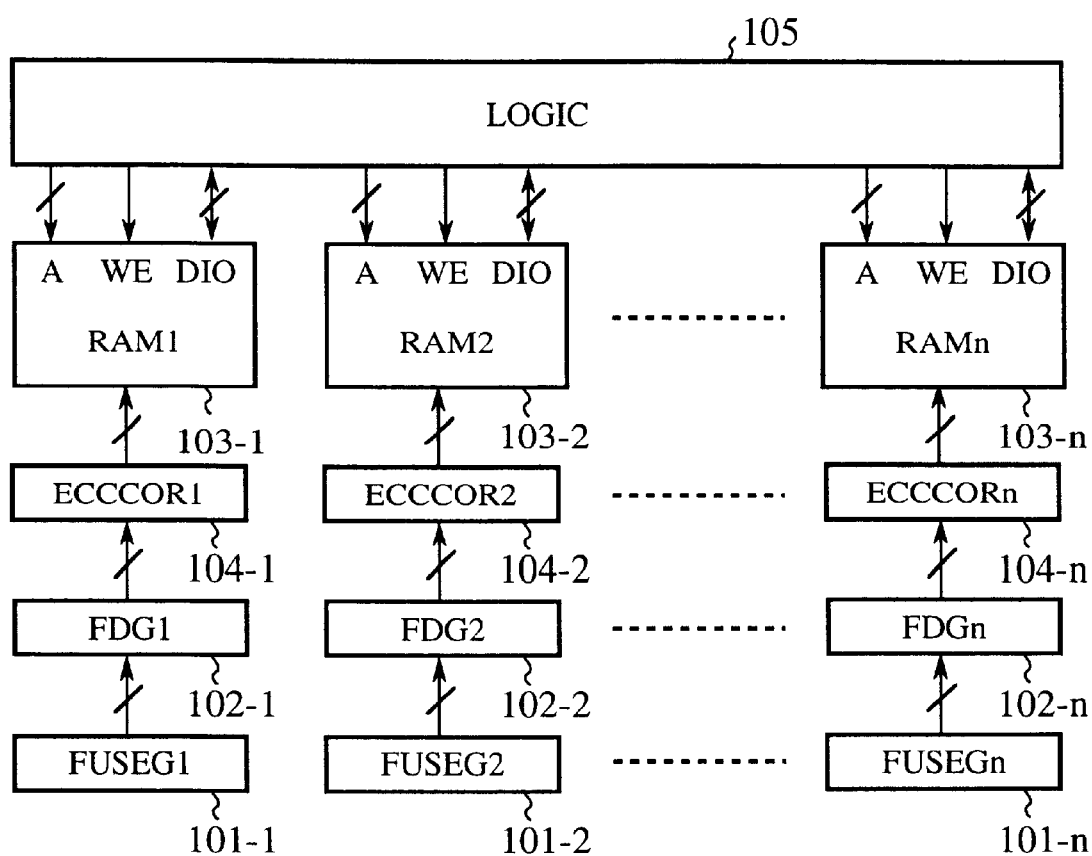
FIG. 20 is another circuit diagram of a conventional semiconductor integrated circuit device.

In the circuit configuration of the semiconductor integrated circuit device in accordance with the embodiment 1 as shown in FIG. 1, the parallel/serial conversion circuit 10 and the plurality of serial/parallel conversion circuits 11-1 to 11-n are required, as compared to that of FIG. 20 as described in the prior art (note: except for the error correction circuit (ECC)). However, the plurality of fuse element groups 101-1 to 101-n and fuse state detection circuit groups 102-1 to 102-n can be eliminated, which are required in the prior art; as a result, an area increase of the semiconductor integrated circuit device may be suppressed.

However, when failures exist in a plurality of RAMs, it may be sometimes impossible to save these failures. But, upon the mass production of semiconductor integrated circuit devices, a probability where defects exist in the plurality of RAMs is sufficiently smaller than that where defects exist in just one RAM. Therefore, the circuit configuration of the semiconductor integrated circuit device in accordance with the embodiment 1 is effective sufficiently with respect to the saving of RAM defects.

As described above, according to the embodiment 1, when only the parallel/serial conversion circuit 10 and serial/parallel conversion circuits 11-1 to 11-n are added to the semiconductor integrated circuit device with a fuse element, the fuse element groups 101-1 to 101-n and the plurality of fuse state detection circuit groups 102-1 to 102-n can be eliminated, thereby controlling an area increase of the whole circuit and reducing the manufacturing costs.

Embodiment 2

FIG. 2 is a circuit diagram of a semiconductor integrated circuit device in accordance with an embodiment 2 of the present invention, and corresponds to a first concrete example of the embodiment 1. In FIG. 2, reference numeral 1001 designates a scan path circuit (SP) and reference symbols P0 to P3 each denote a scan path flip-flop (SFF). The same other numerals above denote the same or corresponding components and these explanation will be omitted. In addition, the internal configuration of the RAM 3-i has been already described above and employs a simple scan path circuit 1001 as a parallel/serial conversion circuit.

In the following, the scan path circuit 1001 will be briefly described. Typically, in a large scale sequence circuit incorporating memory elements, the circuit operation is implemented in time series, which makes it difficult to do test generations only through external terminals. For this reason, in order to allow externally direct control and observation for the memory elements such as flip-flops in the circuit, the memory elements are replaced with another shiftable memory elements, which are connected in series to configure a shift register capable of implementing direct shift-in and shift-out of data externally. Such a shift register connected in series is called a scan path circuit.

Next, the operation will be described below.

The separation information of the fuse element group 1 (4 bits in the figure) is inputted in parallel to the scan path circuit 1001 (4 bits in the figure) in the parallel/serial conversion circuit 10 through the fuse state detection circuit (FD) constructing the fuse state detection circuit group 2, and then converted to serial data through a series shift operation of the scan path circuit 1001 to output the resultant data from SOF output. The output data is converted in serial-to-parallel through the serial/parallel conversion circuit 11-i (4 bits in the figure) to be supplied in the RAM 3-i. For example, when only the fuse element F2 is separated, the corresponding data is {r3, r2, r1, r0}={0, 1, 0, 0}. On the basis of this data, the remedy of faults in the RAMs and the adjustments of these internal timing, power supply voltage, and so on may be carried out.

As described above, according to the embodiment 2, since the circuit is configured such that the RAM 3-i has the power supply circuit 34 and timing generation circuit 35 and that the parallel/serial conversion circuit 10 has the scan path circuit 1001, on the basis of the data of the fuse element group 1, the remedy of faults of the RAM 3-i and the adjustments of the internal timing, power supply voltage, and so on may be carried out.

Embodiment 3

Figure 3:
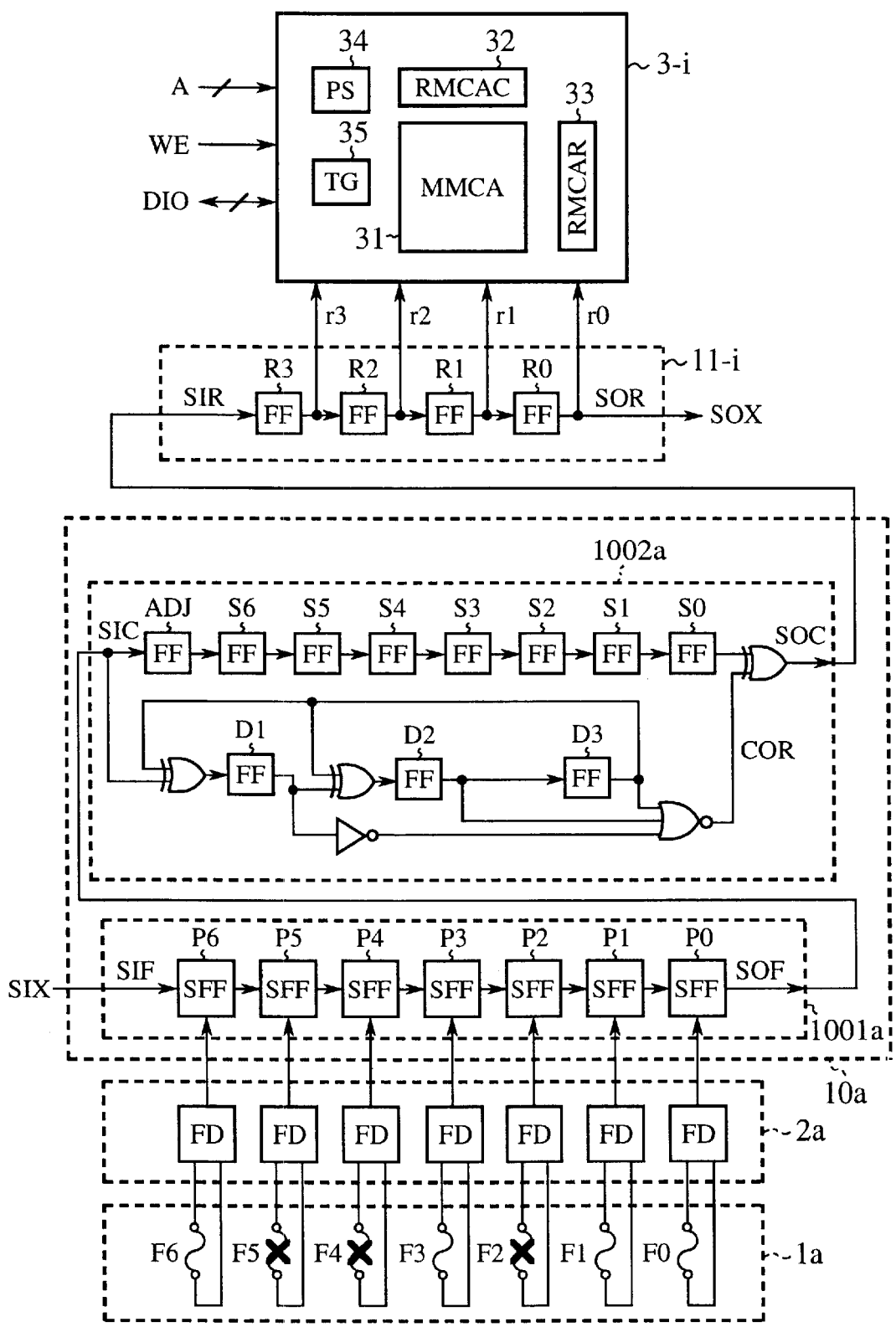
FIG. 3 is a circuit diagram of a semiconductor integrated circuit device in accordance with an embodiment 3 of the present invention.

FIG. 3 is a circuit diagram of a semiconductor integrated circuit device in accordance with an embodiment 3 of the present invention, corresponding to a second concrete example of the embodiment 1. In FIG. 3, reference numeral 1a designates a fuse element group; 2a designates a fuse state detection circuit group; 10a designates a parallel/serial conversion circuit; 1001a designates a scan path circuit; 1002a designates a CRC error correction circuit (CRCCOR), which is the same as that of FIG. 21B as described in the prior art; reference symbol ADJ denotes a flip-flop for timing adjustment (FF); and S0–S6, D1–D3 and R0–R3 each denote a flip-flop. The same other reference numerals above denote the same components or the corresponding parts and these explanations will be omitted.

This example illustrates a circuit which is applied with a CRC of 7 bits containing information bits of 4 bits. A CRC of multiple bits, however, can be applied in practice. Here, the separation of the fuse elements will be carried out so as to constitute a CRC code word. For example, when the information bits are "0010", the programming would be implemented as follows: The fuses F0 and F1 are non-separation, the fuse F2 is separation, and the F3 is non-separation. In this case, since the check bits are "110" corresponding to the information bits of "0010", the programming would be programmed as follows: The fuses F4 and F5 are separation and the fuse F6 non-separation.

Figure 21A:
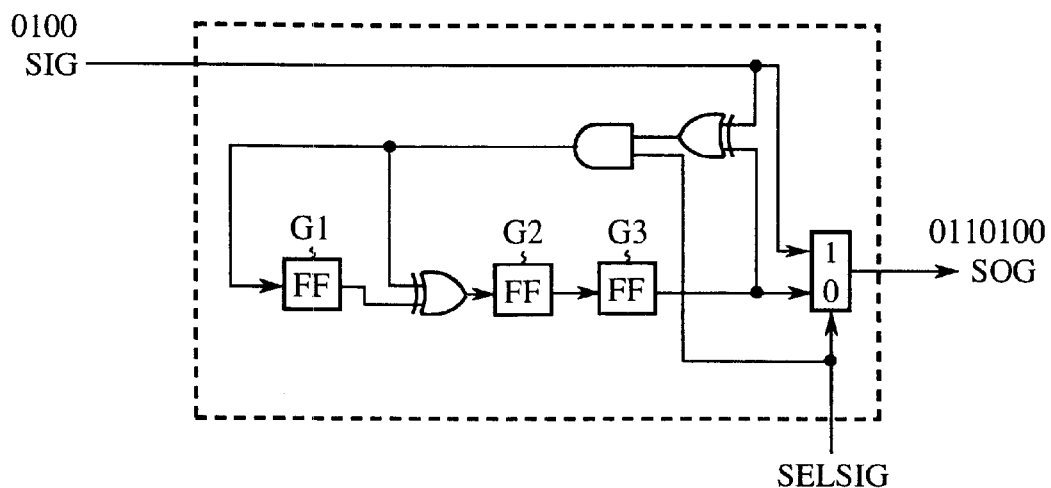
FIGS. 21A and 21B each are a circuit diagram illustrating one example of a conventional CRC circuit.
Figure 21B:
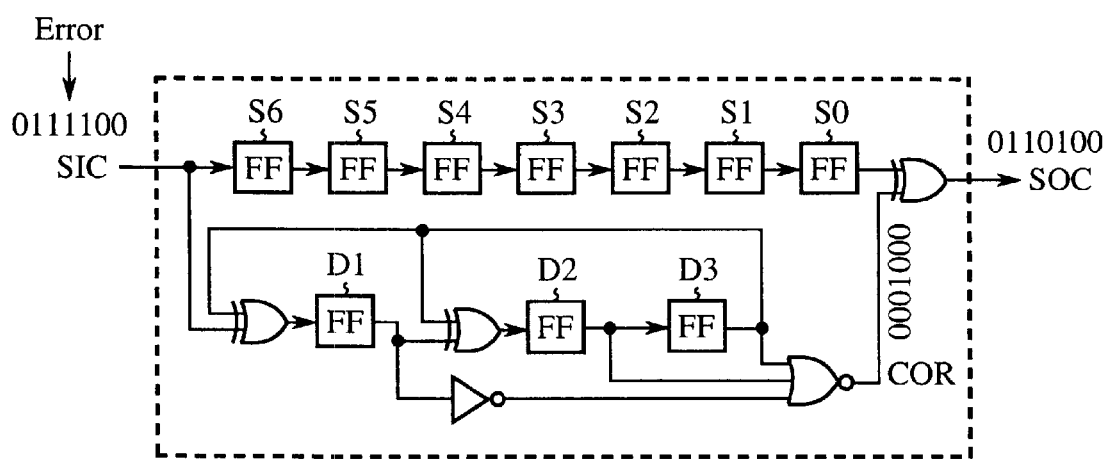

In addition, for example, in FIG. 21B, in a state where the clock of the flip-flops (S0, S1, S2, S3, S4, S5, S6) is stopped in the operation step (2-3), a clock must be supplied to the flip-flops (D1, D2, D3). In the embodiment 3, however, the same clocks can be supplied to the flip-flops S0 to S6 and D1 to D3 owing to the presence of the flip-flop ADJ for timing adjustment, resulting in the circuit control with ease.

Next, the operation will be described below.

(1) the internal data of the fuse elements F0–F6 in the fuse element group 1a is stored as output data in the scan flip-flops P1–P6 in the scan path circuit 1001a, correspondingly.

(2) The flip-flops D1, D2, and D3 and flip-flop ADJ in the CRC error correction circuit 1002a is reset to "0".

(3) The signal input of SIX terminal is set to SIX=0 and data input is done via SIF terminal. The serial shift operation of the scan path circuit 1001a and the operation of the CRC error correction circuit 1002a are done by 8 clocks. Thus, the data of the fuse elements F0–F6 are stored in the flip-flops S0–S6, while the data after error correction to the fuse element F0 is output at SOC output.

(4) The serial shift operation of the scan path circuit 1001a, the operation of the CRC error correction circuit 1002a, and the shift operation of the serial/parallel conversion circuit 11-i are done by 4 clocks. Thus, the information bits of the front, error-corrected 4 bits are stored in the serial/parallel conversion circuit 11-i (R0, R1, R2, R3).

Since the error is corrected as described above, the RAM 3-i can be normally controlled even if an error occurs in the separation of one fuse element in the fuse element group 1a. As a result, the yield of the semiconductor integrated circuit device can be improved. For example, even when the separation of the fuse element F2 results in a failure, the data becomes {r3, r2, r1, r0}={0, 1, 0, 0}, which enables the RAM 3-i to be controlled and corrected.

Figure 19:
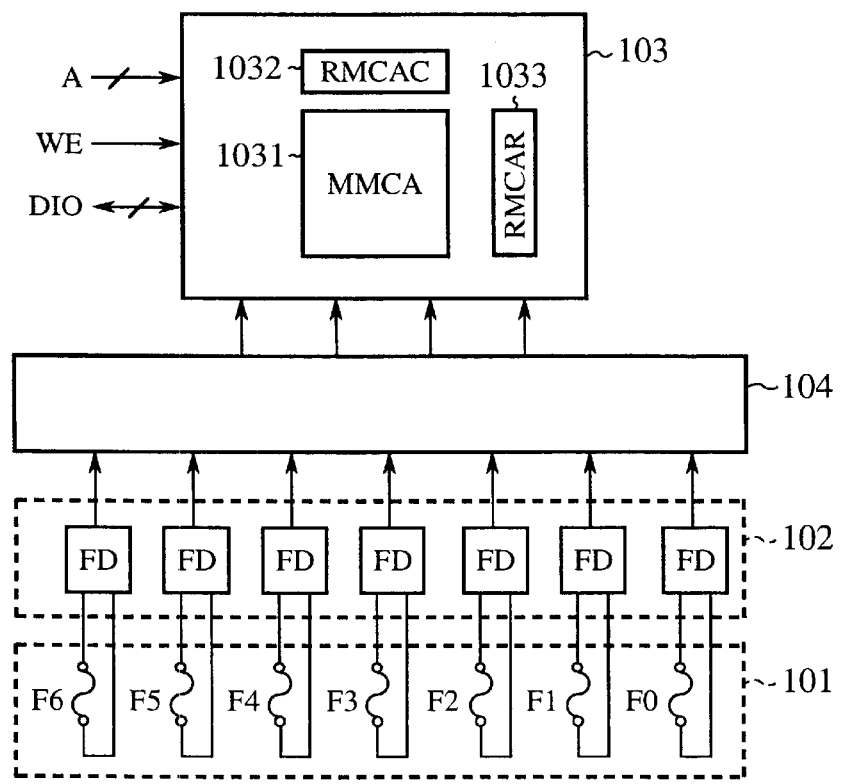
FIG. 19 is another circuit diagram of a conventional semiconductor integrated circuit device.

In general, the ECC error correction circuit 104 of FIG. 19 as described in the prior art requires a large number of exclusive ORs or EOR circuits, and the circuit scale is larger than that of the CRC error correction circuit 1002a. As in the embodiment 3, the application of the CRC error correction circuit 1002a can reduce the total circuit area sufficiently.

As described above, according to the embodiment 3, by addition of the CRC error correction circuit 1002a, even if there are any errors in the separation of the fuse elements, the RAM 3-i may be normally controlled, which not only contributes to an improvement of the production yield, but also enables to reduce the circuit area because of the application of the CRC error correction circuit instead of the ECC error correction circuit.

Embodiment 4

Figure 4:
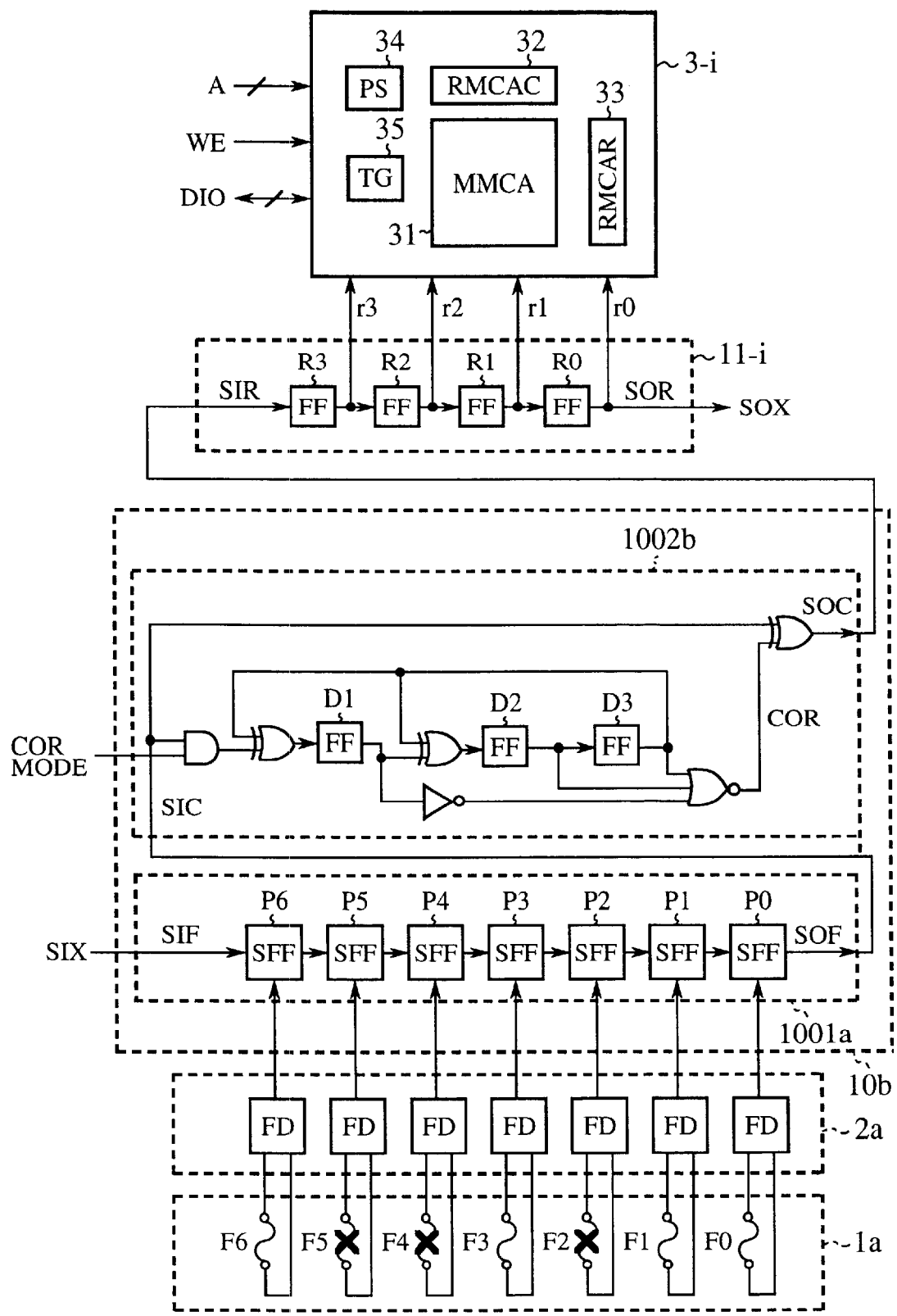
FIG. 4 is a circuit diagram of a semiconductor integrated circuit device in accordance with an embodiment 4 of the present invention.

FIG. 4 is a circuit diagram of a semiconductor integrated circuit device in accordance with an embodiment 4 of the present invention, corresponding to a third concrete example of the embodiment 1. In FIG. 4, reference numeral 10b designates a parallel/serial conversion circuit; 1002b designates a CRC error correction circuit; and the other circuit components are the same as those of FIG. 3. It should be noted herein that as compared with the circuit configuration of the embodiment 3, the shift register, which is present in the CRC error correction circuit 1002a and constructed by the flip-flops S6, S5, S4, S3, S2, S1, and S0, is eliminated in the CRC error correction circuit 1002b.

Next, the operation will be described below.

(1) The data of the fuse elements F0–F6 in the fuse element group 1a is inputted in parallel through the fuse state detection circuit FD, and the internal data of the fuse elements F0–F6 is stored in the scan flip-flops P0–P6 in the scan path circuit 1001a, correspondingly.

(2) The flip-flops D1, D2, and D3 in the CRC error correction circuit 1002b are reset to "0".

(3) In a state where the signal input of CORMODE terminal is CORMODE=1, the serial shift operation of the scan path circuit 1001a and the operation of the CRC error correction circuit 1002b are made by 7 clocks.

(4) The output data of the fuse state detection circuit FD is input in parallel to the scan flip-flops SFF in the scan path circuit 1001a. Thus, the data of the fuses F0–F6 are stored again in the scan flip-flops P0–P6. Synchronously, a clock is supplied to the flip-flops D1, D2, and D3. At this point in time, the data after error correction with respect to the fuse element F0 is outputted to SOC output.

(5) In a state where the signal input of CORMODE terminal is CORMODE=0, the serial shift operation of the scan path circuit 1001a, the operation of the CRC error correction circuit 1002a, and the shift operation of the serial/parallel conversion circuit 11-i are done by 4 clocks. Thus, the information bits of the front, error-corrected 4 bits are stored in the flip-flops R0–R3 of the serial/parallel-conversion circuit 11-i.

In such a way, the error correction in the separation of the fuse element can be performed, and the shift register composed of the flip-flops S0–S6 can be also reduced as compared with the circuit configuration of FIG. 3, permitting a further reduction of the circuit area.

As described above, according to the embodiment 4, since the shift register composed of the flip-flops S0–S6 according to the embodiment 3 is eliminated in the CRC error correction circuit 1002b, further reducing the circuit area of the semiconductor integrated circuit device and also the production cost in addition to the aforementioned effect.

Embodiment 5

Figure 5:
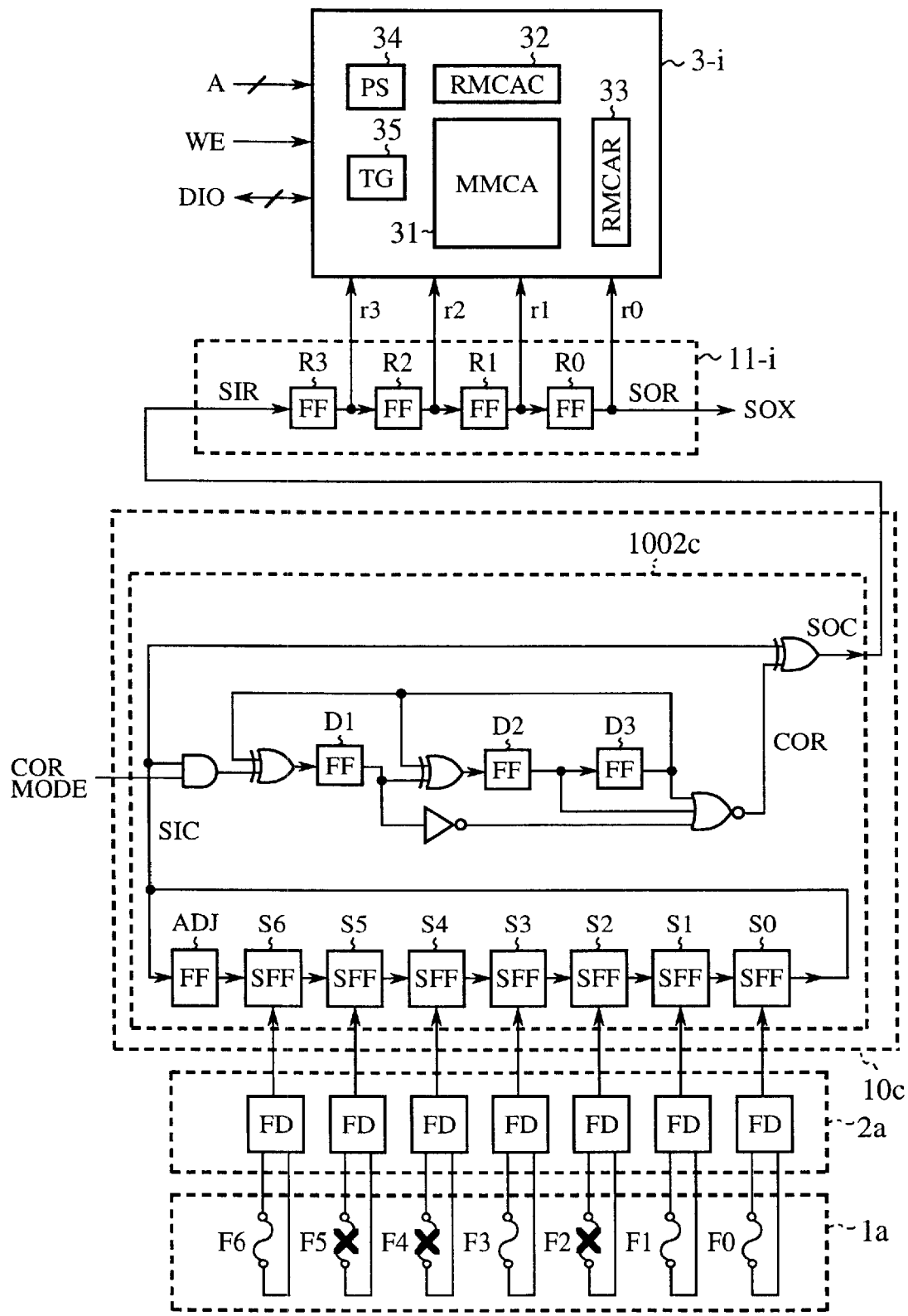
FIG. 5 is a circuit diagram of a semiconductor integrated circuit device in accordance with an embodiment 5 of the present invention.

FIG. 5 is a circuit diagram of a semiconductor integrated circuit device in accordance with an embodiment 5 of the present invention, corresponding to a fourth concrete example of the embodiment 1. In FIG. 5, reference numeral 10c designates a parallel/serial conversion circuit; 1002c designates a CRC error correction circuit; and the other components are the same as those of FIG. 3. It should be noted herein that as compared with the circuit configuration of the embodiment 3, the scan path circuit 1001a is eliminated and that the flip-flops (S6, S5, S4, S3, S2, S1, and S0) are changed to the scan flip-flops (SFF).

Next, the operation will be described below.

(1) The internal data of the fuse elements F0–F6 in the fuse element group 1a is input in parallel to the scan flip-flops (SFF) through the fuse state detection circuits (FD).

(2) The flip-flops D1, D2, D3, and ADJ in the CRC error correction circuit 1002c are reset to "0".

(3) In a state where the input signal of CORMODE terminal is CORMODE=1, the operation of the CRC error correction circuit is performed by 8 clocks. Thus, the scan flip-flops S0–S6 are gone back to the original data and the data after error correction with respect to the fuse element F0 is outputted from SOC output.

(4) In a state where the input signal of CORMODE terminal is CORMODE=0, the operation of the CRC error correction circuit 1002c and the shift operation of the serial/parallel conversion circuit 11-i are performed by 4 clocks. Thus, the information bits of the front, error-corrected 4 bits are stored in the flip-flops (R0, R1, R2, R3) of the serial/parallel conversion circuit 11-i.

In such a way, an error correction in the separation of the fuse element can be achieved. In addition, since the scan path circuit 1001a is eliminated as compared with the circuit configuration of FIG. 3, the circuit area may be further reduced.

As described above, according to the embodiment 5, since the scan path circuit 1001a in accordance with the embodiment 3 is eliminated in the CRC error correction circuit 1002c, the circuit area may be further reduced in addition to the aforementioned effect.

Embodiment 6

Figure 6:
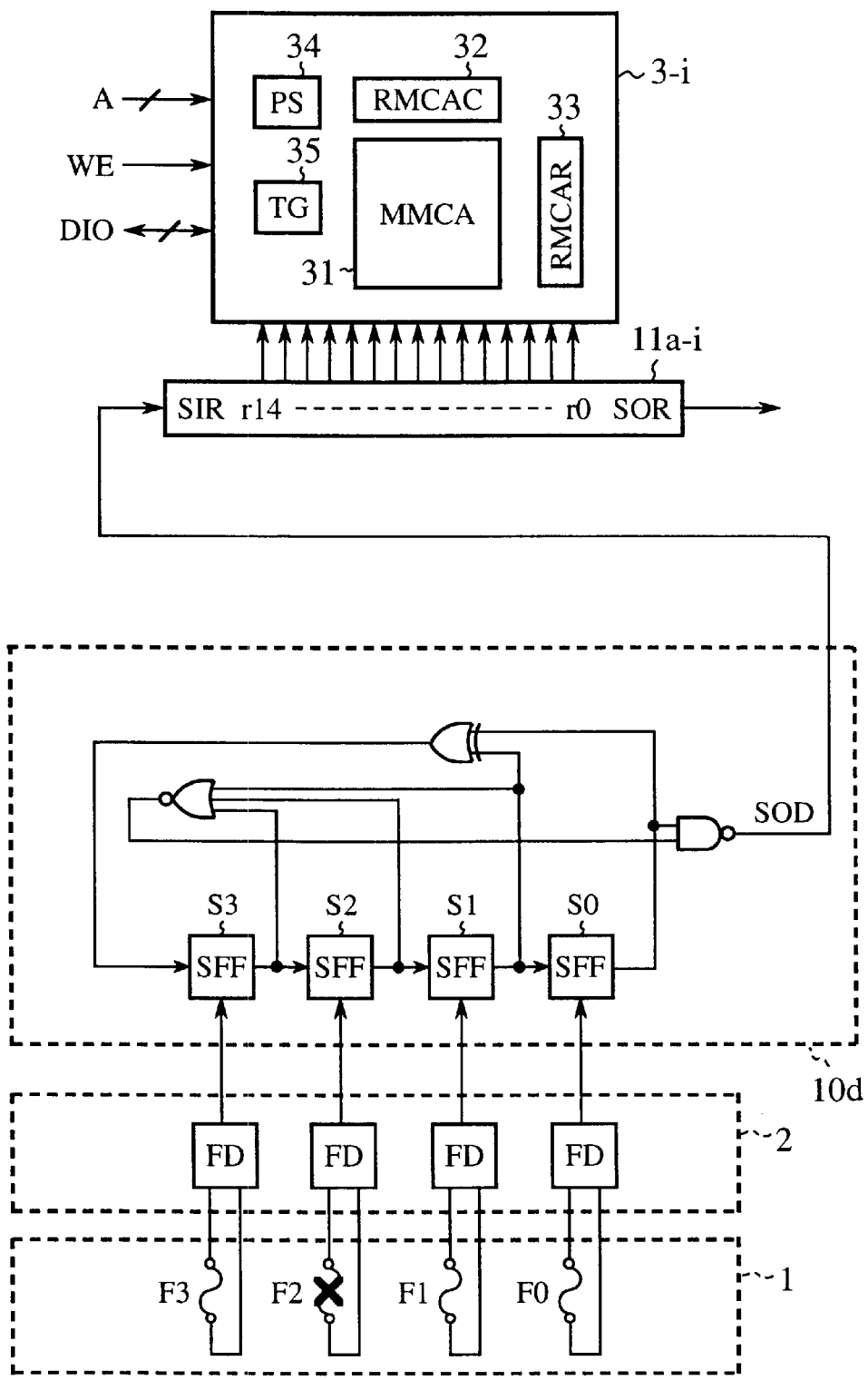
FIG. 6 is a circuit diagram of a semiconductor integrated circuit device in accordance with an embodiment 6 of the present invention.

FIG. 6 is a circuit diagram of a semiconductor integrated circuit device in accordance with an embodiment 6 of the present invention, corresponding to a fifth concrete example of the embodiment 1. In FIG. 6, reference numeral 10d designates a parallel/serial conversion circuit; 11a–i designates a serial/parallel conversion circuit; S0–S3 each designate a scan flip-flop; and the other circuit components are the same as those of FIG. 2 in the embodiment 2.

It should be noted herein that a counter circuit having an LFSR (Linear Feedback Shift Register) counter function and a specific mode detection circuit which detects to be in a specific mode of the counter are added, as compared with the circuit configuration of the embodiment 2. In other words, in the parallel/serial conversion circuit 10d, the counter circuit is constructed by the scan flip-flops (S3–S0) and a 2-input EOR circuit which connects its inputs with the outputs of the flip-flops S1 and S0 out of the SFFS, while the specific mode detection circuit is constructed by a 3-input NOR circuit which connects its inputs with three outputs of the scan flip-flops S3–S1, and a 2-input NAND circuit which connects its inputs with the outputs of the 3-input NOR circuit and the scan flip-flop S0.

Next, the operation will be described below.

In the example of the parallel/serial conversion circuit 10d as shown in FIG. 6, when the scan flip-flops (SFF) are S3=0, S2=0, S1=0 and S0=0, respectively, SOD output through a NAND circuit is SOD=0 (in the other states, the SOD output is SOD=1). The serial/parallel conversion circuit 11a–i transmitted by the SOD output is used with one having a bit length of $2^m-1$ at the maximum (15 in the example of FIG. 5) corresponding to the number m of information bits (m=4 in the example of FIG. 6). It should be noted herein that since the LFSR does not operate when all the registers are put in "0" state, it can count only the $2^m-1$ states at the maximum.

In such a way, when the scan flip-flops (SFF) perform the shift operation of these S0, S1, S2 and S3, the parallel/serial conversion circuit 10d can operate as an LFSR.

In the example as shown in FIG. 6, in a state where the scan flip-flops (SFF) are S3=0, S2=0, S1=0, and S0=0, the SOD output is "0", while in the other states the SOD output is "1". Accordingly, when the count operation of the LFSR and shift operation of the serial/parallel conversion circuit 11a–i are performed by 15 clocks, any one bit of the serial/parallel conversion circuit 11a–i can be set with "0" (the other bit is "1"). Namely, the decoded information can be supplied to the RAM 3-i.

Note that when the scan flip-flops are S3=0, S2=0, S1=0, and S0=0 (when any fuses are not blown), the SOD output is always "1", and thereby the serial/parallel conversion circuit 11a–i is set with "1" in all the bits.

As described above, according to the embodiment 6, since the parallel/serial conversion circuit 10d is provided with a decode function, there is need for a decode circuit in the RAM 3-i, thereby eliminating the increase of another decode circuit.

Embodiment 7

Figure 7:
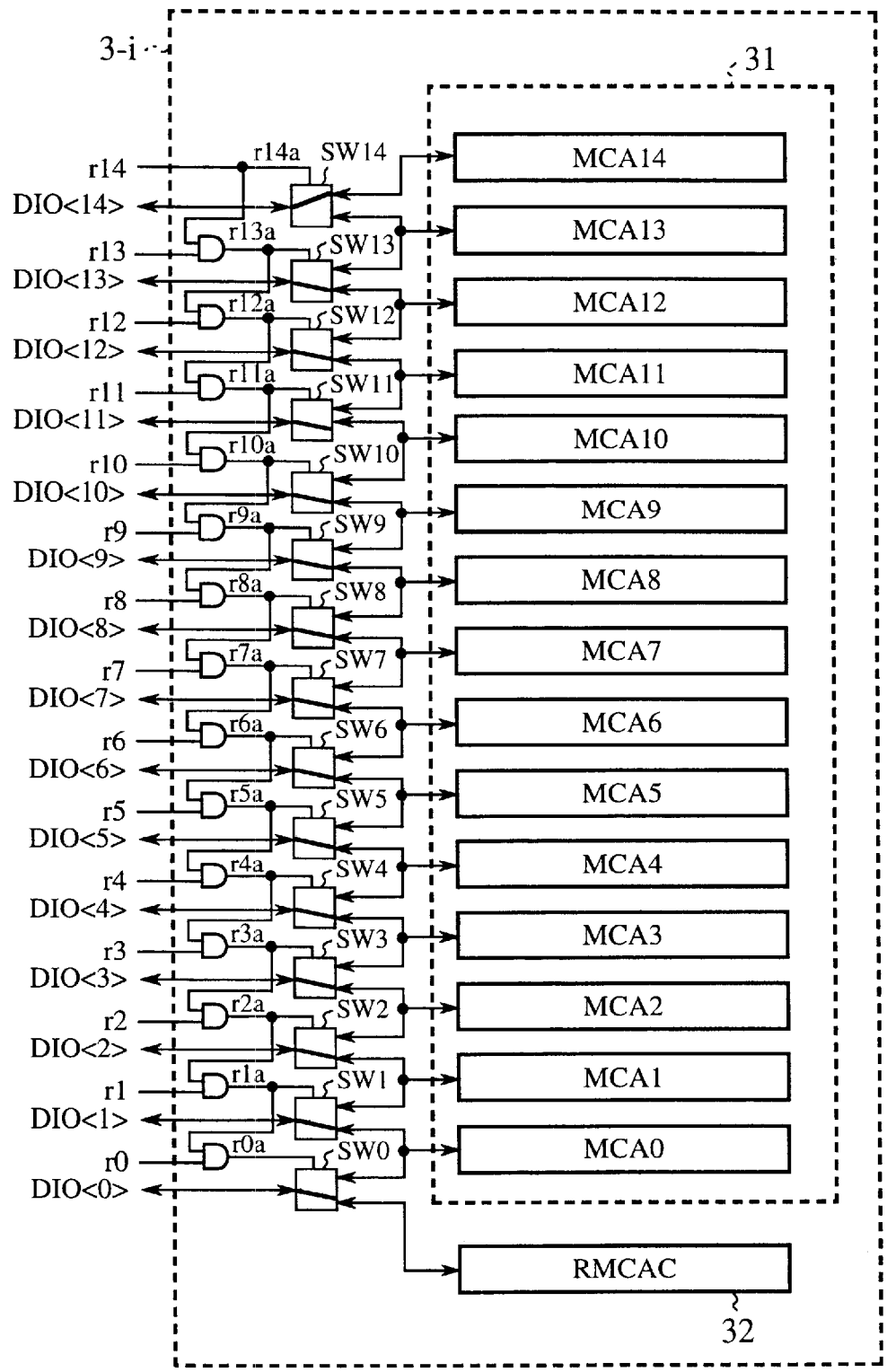
FIG. 7 is a detailed circuit diagram of a RAM in accordance with an embodiment 7 of the present invention.

FIG. 7 is a detailed circuit diagram of a RAM in accordance with an embodiment 7 of the present invention, and one example of the circuit configuration of the RAM 3-i when the parallel/serial conversion circuit 10d having a decode function as shown in FIG. 6 in the embodiment 6 is used.

In FIG. 7, reference symbol or numeral SW0–SW14 each denote a switch; DIO<0> to DIO<14> each denote a data input/output terminal; numeral 31 designates a main memory cell array (MMCA); 32 designates a redundancy memory cell array for columns; MCA0 to MCA14 each denote a sub-memory cell array constituting the main memory cell array 31 and correspond to the input/outputs of the data input/output terminals DIO<0> to DIO<14>, respectively, when there are no failures. Note that an object to be controlled of the RAM3-i as shown in FIG. 7 is directed to the redundancy memory cell array for columns 32.

Next, the operation will be described below.

For example, assuming that a failure exists in the sub-memory cell array MCA13, the fuse element group 1 in the corresponding circuit configuration of FIG. 6 is programmed so as to achieve {r14, r13, r12, r11, r10, r9, r8, r7, r6, r5, r4, r3, r2, r1, r0}={1, 0, 1, 1, 1, 1, 1, 1, 1, 1, 1, 1, 1, 1, 1}. In FIG. 7, the switches SW0–SW14 are appropriately changed over on the basis of the function of the AND circuit of a logic gate connected in series.

Thus, the following replacements are carried out: DIO<14> corresponds to the MCA14; DIO<13> to the MCA12; DIO<12> to MCA11; DIO<11> to MCA10; DIO<10> to MCA9; DIO<9> to MCA8; DIO<8> to MCA7; DIO<7> to MCA6; DIO<6> to MCA5; DIO<5> to MCA4; DIO<4> to MCA3; DIO<3> to MCA2; DIO<2> to MCA1; DIO<1> to MCA0; and DIO<0> to the redundancy memory cell array for columns 32. As a result, the failure saving can be performed.

As described above, according to the embodiment 7, the failure saving of the sub-memory cell arrays MCA0 to MCA14 which constitute the main memory cell array 31 of the RAM 3-i can be achieved, on the basis of the functions of the AND gates and switches SW0–SW14 which are respectively connected in series corresponding to the input/outputs of the data input/output terminals DIO<0> to DIO<14>.

Embodiment 8

Figure 8:
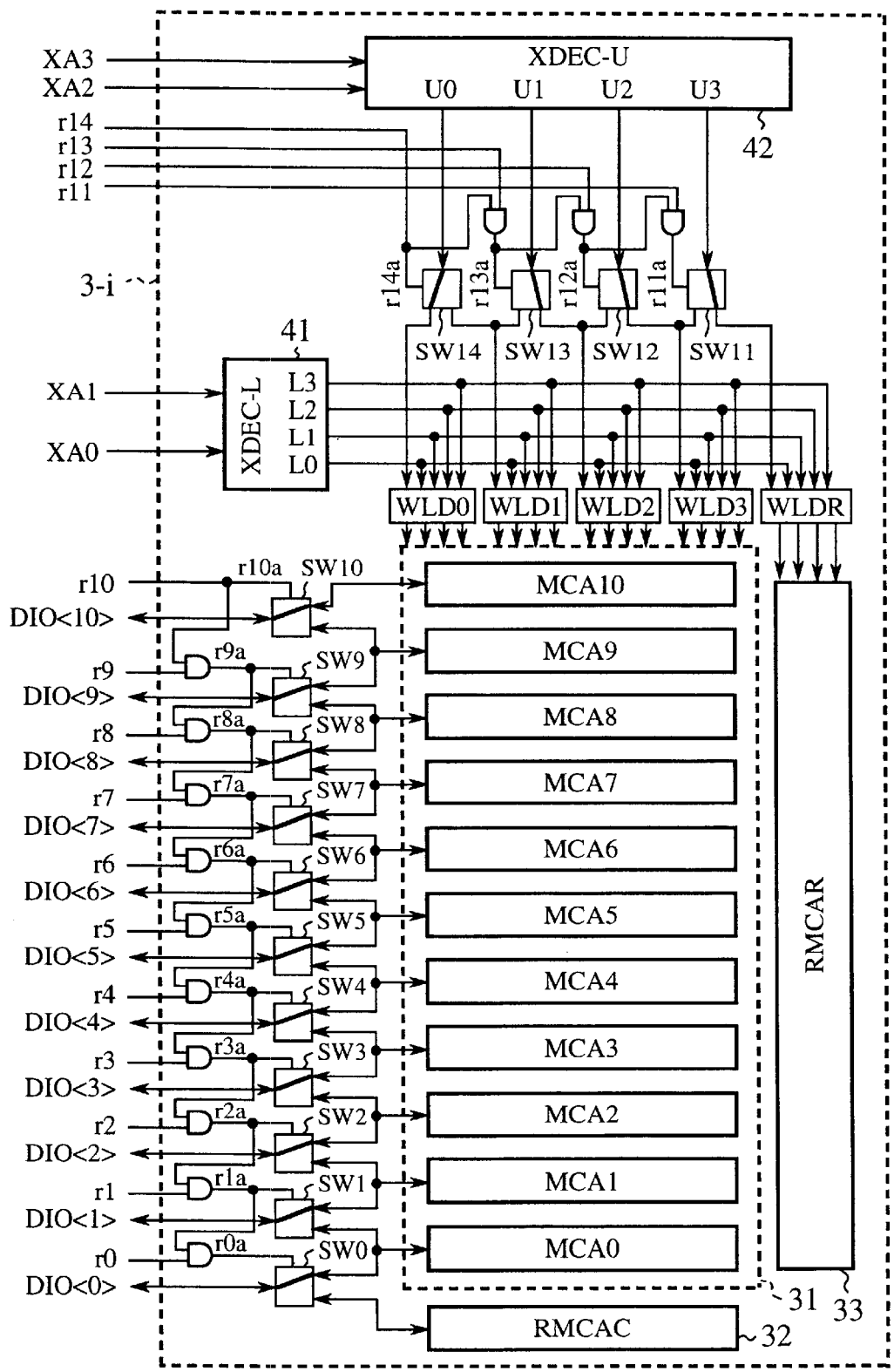
FIG. 8 is a detailed circuit diagram of a RAM in accordance with an embodiment 8 of the present invention.

FIG. 8 is a detailed circuit diagram of a RAM in accordance with an embodiment 8 of the present invention, and one example of the circuit configuration of the RAM 3-i when the parallel/serial conversion circuit 10d having a decode function as shown in FIG. 6 in the embodiment 6 is used.

In FIG. 8, reference symbol or numeral SW0–SW14 and SW11–SW14 each denote a switch; DIO<0> to DIO<10> each denote a data input/output terminal; numeral 31 designates a main memory cell array (MMCA); 32 designates a redundancy memory cell array for columns (RMCAC); 41 designates a lower row address decoder (XDEC-L); 42 designates a upper row address decoder (XDEC-U); WLD0 to WLD3 and WLDR each designate a word line driver; and MCA0 to MCA10 each designate a sub-memory cell array constituting the main memory cell array 31.

However, when no faults exist in the sub-memory cell arrays MCA0 to MCA10, these corresponds to the input/outputs of the data input/output terminals DIO<0> to DIO<10>, respectively, while any one of the word line drivers WLD0 to WLD3 and WLDR is activated on the basis of the output signal of the upper row address decoder XDEC-U.

Further, the switches SW11–SW14 are provided between the upper row address decoder 42 and the word line drivers WLD0 to WLD3 and WLDR. This arrangement enables a replacement to avoid the word line driver corresponding to the word line in which a failure exists. Here, when the saving is performed with the redundancy memory cell array for columns 32, it is the same as that of FIG. 7, and the explanation will be omitted.

Next, the operation will be described below.

For example, assuming that a failure exists in 4 word lines corresponding to the word line driver WLD1, the fuse element group 1 in the corresponding circuit configuration of FIG. 6 is programmed so as to achieve {r14, r13, r12, r11, r10, r9, r8, r7, r6, r5, r4, r3, r2, r1, r0}={1, 0, 1, 1, 1, 1, 1, 1, 1, 1, 1, 1, 1, 1, 1}.

The switches SW0–SW14 are appropriately changed over on the basis of the function of the AND circuit of a logic gate which is connected in series with the corresponding switch, as shown in FIG. 8. In such a way, the U0, U1, U2, and U3 terminals of the upper row address decoder 42 are replaced so as to correspond to the word line drivers WLD0, WLD2, WLD3, and WLDR, thereby performing the failure saving. The redundancy memory cell array for rows 33 is employed for this failure saving.

As described above, according to the embodiment 8, the failure saving of the word line corresponding to the word line drivers WLD0 to WLDR in the RAM 3-i can be achieved, on the basis of the functions of the AND gates and switches SW0–SW10 which are respectively connected in series corresponding to the input/outputs of the data input/output terminals DIO<0> to DIO<10>.

Embodiment 9

Figure 9:
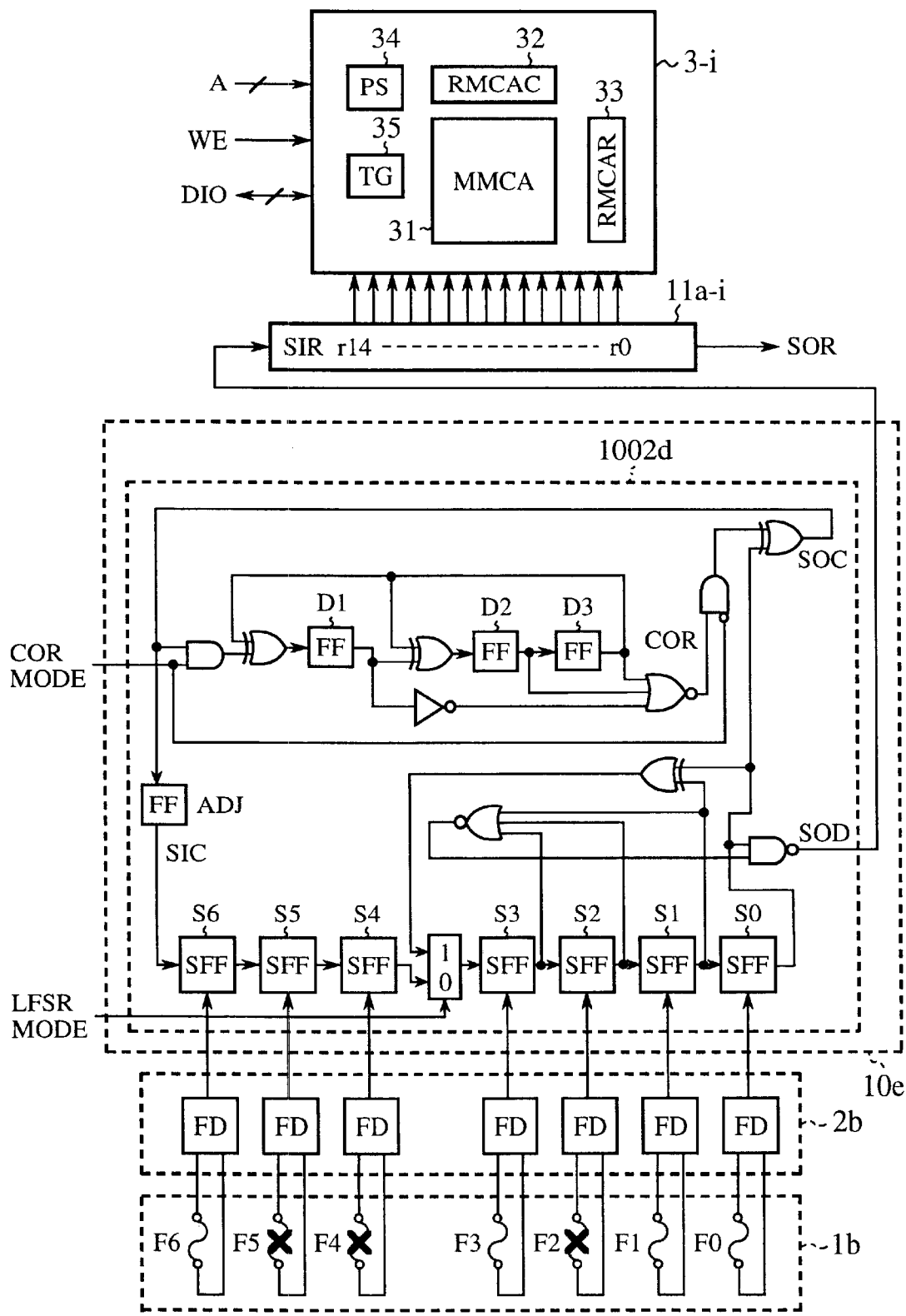
FIG. 9 is a circuit diagram of a semiconductor integrated circuit device in accordance with an embodiment 9 of the present invention.

FIG. 9 is a circuit diagram of a semiconductor integrated circuit device in accordance with an embodiment 9 of the present invention. In FIG. 9, reference numeral 10e designates a parallel/serial conversion circuit; and 1002d designates a CRC error correction circuit (CRCCOR) in which a CRC technique is applied to the circuit configuration of the embodiment 6. It must be noted that it is configured so that SOC output data after error correction can be inputted to the shift register in the parallel/serial conversion circuit 10e which is constituted by {S6, S5, S4, S3, S2, S1, S0}.

Next, the operation will be described below.

(1) The output data of the fuse state detection circuits (FD) is inputted in parallel to the scan flip-flops (SFF) in the CRC error correction circuit 1002d. Thus, the internal data of the fuse elements F0–F6 is stored in the scan flip-flop S0–S6, correspondingly.

(2) The flip-flops D1, D2, D3, and ADJ are reset to "0" in the parallel/serial conversion circuit 10e.

(3) In a state where the signal inputs of CORMODE and LFSRMODE terminals are respectively set to CORMODE=1 and LFSRMODE=0, the operation of the CRC error correction circuit 1002d is performed by clocks. Thus, the scan flip-flops S0–S6 return to a primary data (at this time the error correction is not performed), and the data after error correction to the fuse element F0 is outputted to SOC output.

(4) In a state where the signal inputs of CORMODE and LFSRMODE terminals are respectively set to CORMODE=0 and LFSRMODE=0, the operation of the CRC error correction circuit 1002d is performed by 8 clocks. Thus, the error corrected data is stored in {S6, S5, S4, S3, S2, S1, S0} of the scan flip-flops (SFF).

(5) In a state where the signal input of the LFSRMODE terminal is LFSRMODE=1, the same operation as that of FIG. 6 is performed.

Since the other functions are the same as those of FIG. 6, the circuit configurations of FIGS. 7 and 8 are applicable to the embodiment 9.

As described above, according to the embodiment 9, in the circuit configuration of FIG. 9, since the error correction of the information of the fuse elements F0–F6 can be performed through the CRC error correction circuit 1002d provided in the parallel/serial conversion circuit 10e, the production yield may be improved.

Embodiment 10

FIG. 10 is a schematic circuit diagram of a semiconductor integrated circuit device in accordance with an embodiment 10 of the present invention, and is different from that of FIG. 1 in that the serial/parallel conversion circuits 11-1 to 11-n corresponding respectively to the RAM 3-1 to RAM 3-i are connected in series, thus constituting a long serial/parallel conversion circuit.

With respect to the circuit configuration of FIG. 10, when the parallel/serial conversion circuits 10a–10c with the CRC error correction circuits 1002a–1002c respectively as shown in FIGS. 3, 4, and 5 are employed, there are advantages that the plurality of ECC error correction circuits 104-1 to 104-n are not required as compared to that of FIG. 20 in the prior art.

However, the serial/parallel conversion circuits 11-1 to 11-n and the parallel/serial conversion circuits 10 with a CRC error correction circuit are required instead. The CRC error correction circuit is applied with one having corresponding to the total number of bits of the serial/parallel conversion circuits 11-1 to 11-n.

Typically, the ECC error correction circuit requires a large number of exclusive OR circuits, and has a larger circuit scale than the CRC error correction circuit. For this reason, as in the circuit configuration of the embodiment 10, even if the serial/parallel conversion circuits 11-1 to 11-n are connected in series, the effect of circuit area reduction is obtained sufficiently.

In addition, the parallel/serial conversion circuits 10d and 10e with a decode function, as shown in FIGS. 6 and 9, are also applicable to the circuit configuration of the embodiment 10. This will be described later in another embodiment.

As described above, according to the embodiment 10, since the serial/parallel conversion circuit 11-1 to 11-n corresponding to the RAM 3-1 to 3-n are connected in series to constitute a simple long serial/parallel conversion circuit, which connects to the fuse element group 1 through the parallel/serial conversion circuit 10 with a CRC error correction circuit, the circuit area may be reduced by no use of the ECC error correction circuit.

Embodiment 11

Figure 11:
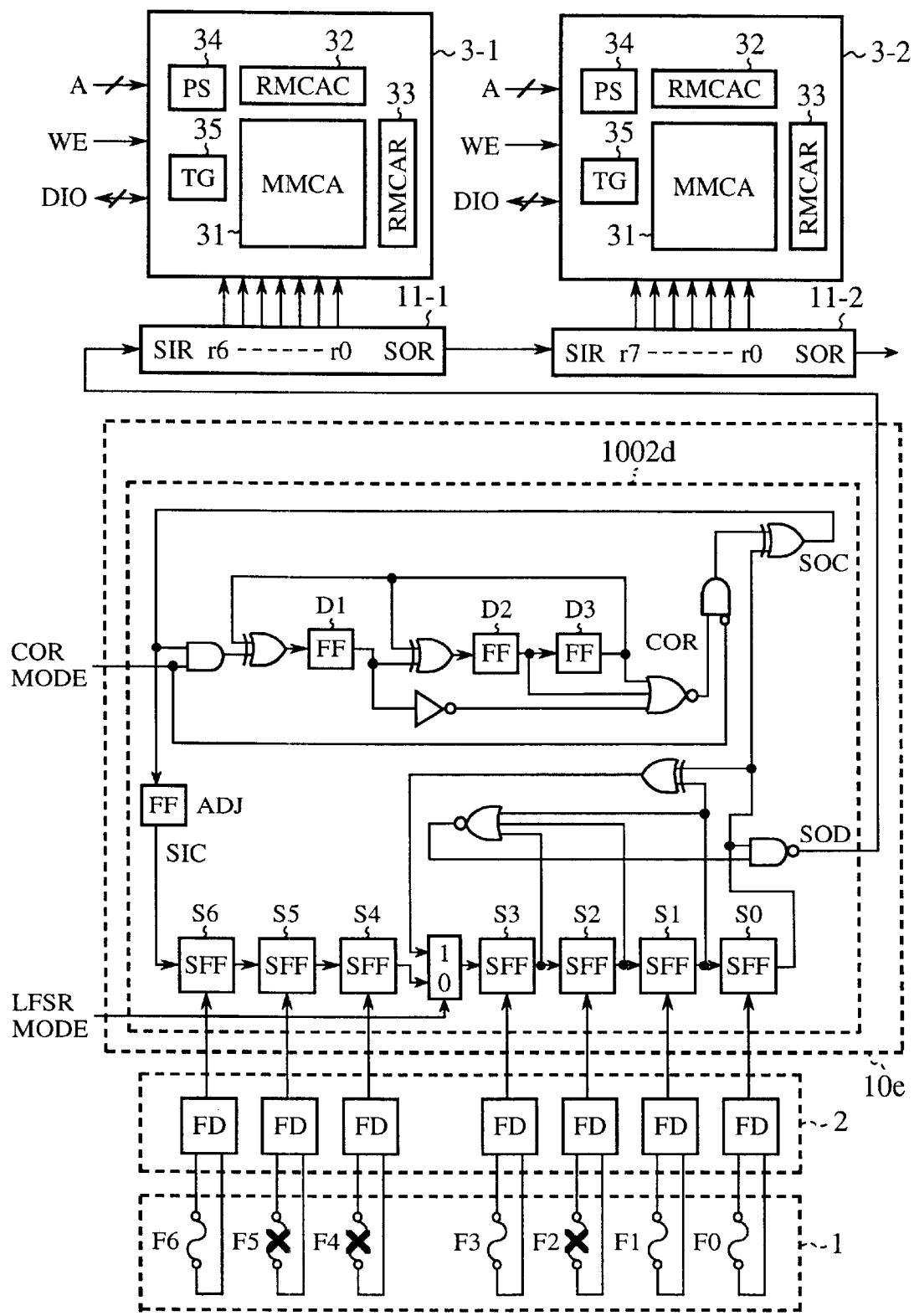
FIG. 11 is a circuit diagram of a semiconductor integrated circuit device in accordance with an embodiment 11 of the present invention.

FIG. 11 is a circuit diagram of a semiconductor integrated circuit device in accordance with an embodiment 11 of the present invention. In FIG. 11, reference numerals 11-1 and 11-n each designate a serial/parallel conversion circuit; and 3-1 and 3-2 each designate a RAM. This illustrates an example that the parallel/serial conversion circuit 10e with a decode function, as shown in FIGS. 6 and 9, and the two RAMs are employed to the circuit configuration of FIG. 10.

Next, the operation will be described below.

The parallel/serial conversion circuit 10e is equal to that of FIG. 9 and the explanation will be omitted. Note that the parallel/serial conversion circuit 10d without the CRC error correction circuit, as shown in FIG. 6, is also applicable thereto. However, in the example of the embodiment 11, the following aspect is illustrated: the decoded information of 15 bits is transmitted from SOD output; the information of 8 bits is transmitted to the RAM 3-2 through the serial/parallel conversion circuit 11-2, while the information of 7 bits is supplied to the RAM 3-1 through the serial/parallel conversion circuit 11-1.

For example, as shown in FIG. 11, when the fuse elements F2, F4 and F5 in the fuse element group 1 are separated, the serial/parallel conversion circuit 11-1 corresponds to {r6, r5, r4, r3, r2, r1, r0}={1, 0, 1, 1, 1, 1, 1}, while the serial/parallel conversion circuit 11-2 corresponds to {r6, r5, r4, r3, r2, r1, r0}={1, 1, 1, 1, 1, 1, 1}. Here, the RAM containing "0" is a RAM to be controlled (in this instance, RAM 3-1). The data of "1" is supplied to all the other RAMs from the corresponding serial/parallel conversion circuits.

As described above, according to the embodiment 11, since the circuit is configured with the parallel/serial conversion circuit 10e with a decode function, when the decode circuit which had been required in the RAMs 3-1 and 3-2, objects to be controlled, is substituted by the above decode function, the decode circuit will be eliminated. As a result, the total circuit area may be reduced.

Embodiment 12

Figure 12:
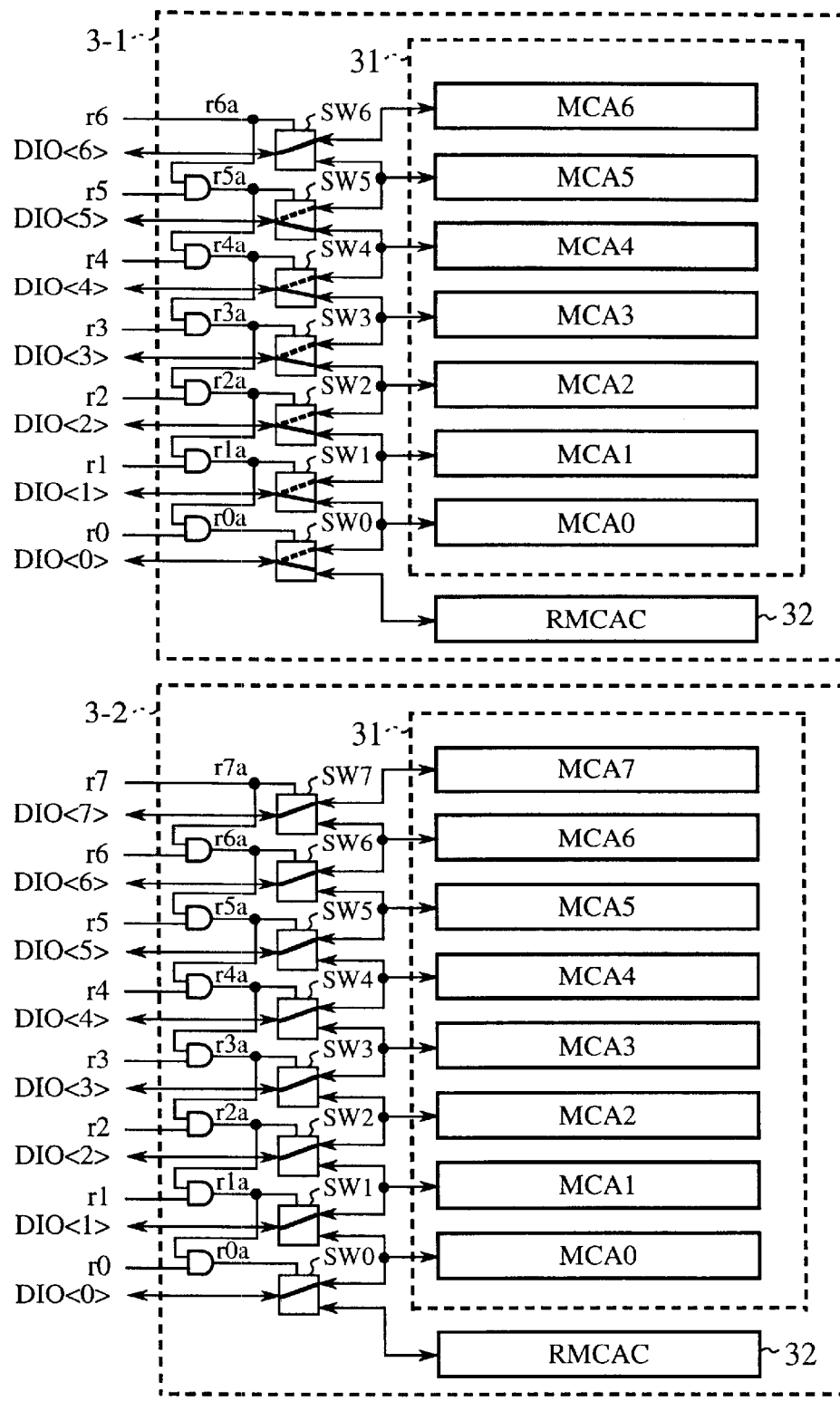
FIG. 12 is a detailed circuit diagram of a RAM in accordance with an embodiment 12 of the present invention.

FIG. 12 is a detailed circuit diagram of a RAM in accordance with an embodiment 12 of the present invention, and a configuration example of RAMs 3-1 and 3-2, particularly, when a failure saving with a redundancy memory cell array for columns (RMCAC) 32 is applied to the circuit configuration of FIG. 11. With respect to the failure saving of each RAM, the circuit configuration is equal to that of FIG. 7 and the explanation will be omitted. In addition, the same circuit as FIG. 8 is also applicable to FIG. 11.

Embodiment 13

Figure 17:
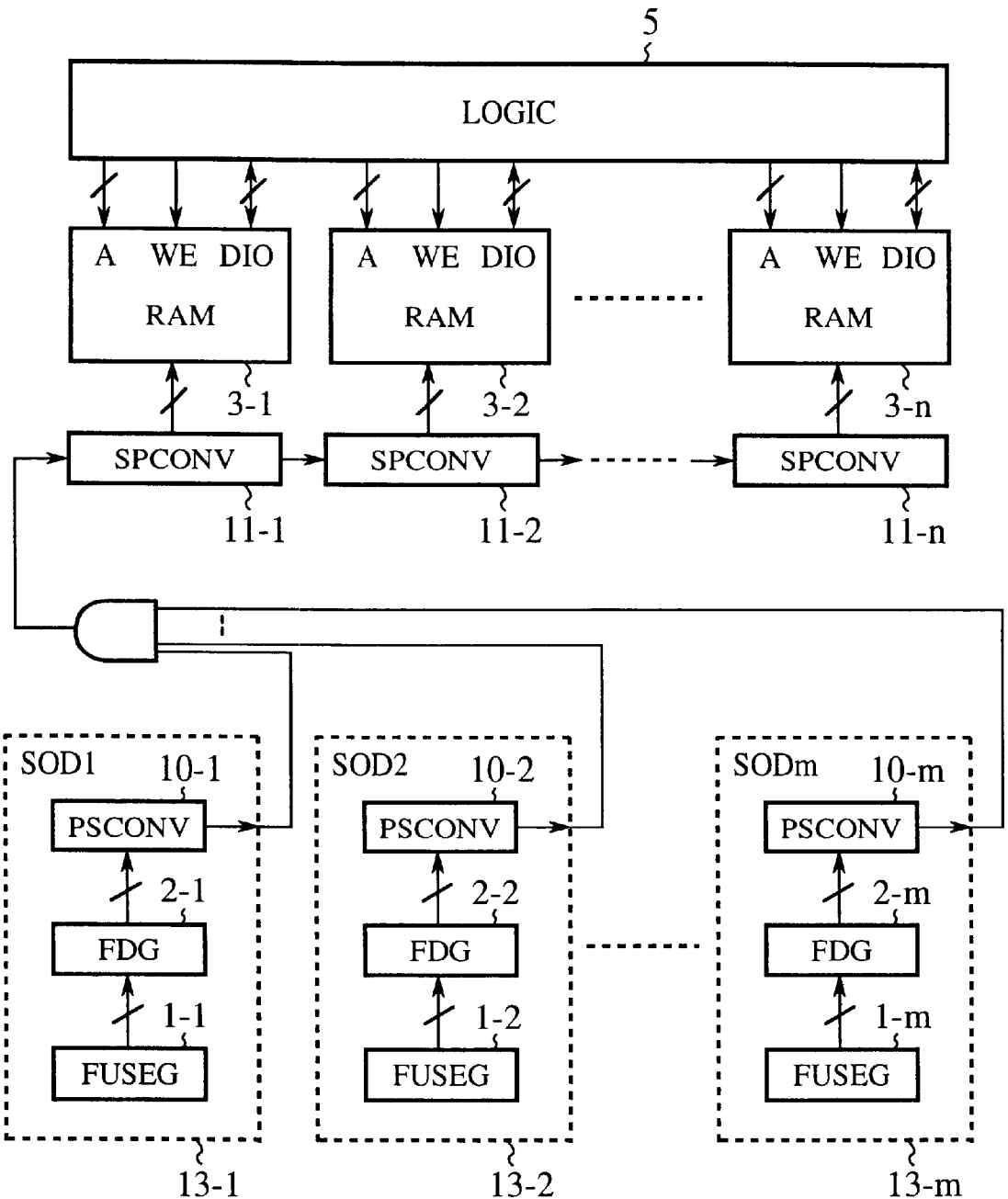
FIG. 17 is a schematic circuit diagram of a semiconductor integrated circuit device in accordance with an embodiment 13 of the present invention.
Figure 18:
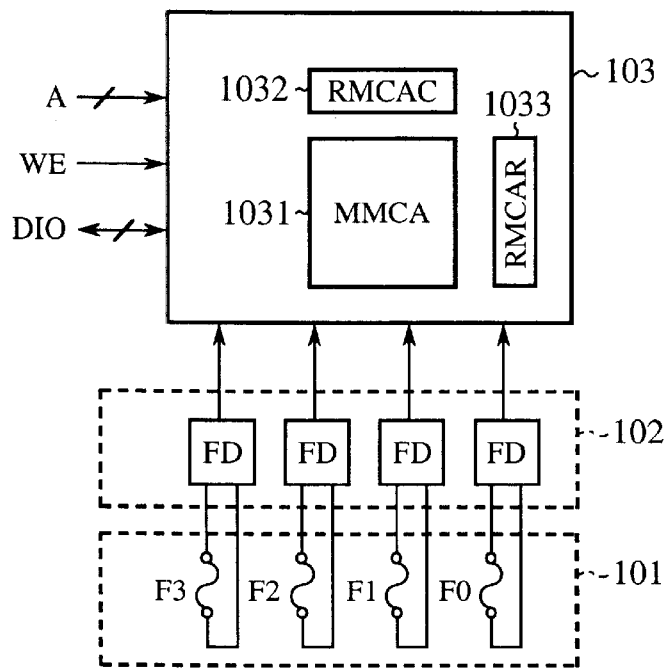
FIG. 18 is a schematic circuit diagram of a conventional semiconductor integrated circuit device.

FIG. 17 is a schematic circuit diagram of a semiconductor integrated circuit device in accordance with an embodiment 13 of the present invention. In FIG. 17, reference numeral 3-1 to 3-n each designate a RAM; 11-1 to 11-n (n: natural number) each designate a serial/parallel conversion circuit; 1-1 to 1-m each designate a fuse element group (FUSEG); 2-1 to 2-m each designate a fuse state detection circuit group (FDG); 10-1 to 10-m each designate a parallel/serial conversion circuit (PSCONV); 13-1 to 13-m (m: natural number) each designate a circuit set composed of FUSEG, FDG, and PSCONV. Here, the circuit sets 13-1 to 13-m may differ in the number of bits.

This improve the circuit configuration of FIG. 10 to be capable of saving the failures of a plurality of RAMs, and assumes to employ the parallel/serial conversion circuits 10d and 10e with a decode function as shown in FIGS. 6 and 11.

The outputs of the parallel/serial conversion circuits 10-1 to 10-m are subjected to AND operation through an AND circuit of a logic gate, and the resultant is supplied to a group of the serial/parallel conversion circuits 11-1 to 11-n which are connected in series. Therefore, m failed RAMs may be saved at the maximum out of n RAMS. 3-1 to 3-n.

As described above, according to the embodiment 13, since the outputs of the parallel/serial conversion circuits 10-1 to 10-m are supplied to a group of the serial/parallel conversion circuits 11-1 to 11-n, a -plurality of the RAMs may be saved, thereby improving the production yield.

Hereinafter, modifications-of the aforementioned embodiments will be described.

The switches (SW0–SW14 and so on) are controlled through the AND circuits which are connected in series in FIGS. 7, 8, and 12, and such an AND function can be added to the side of the serial/parallel conversion circuit (SPCONV). For example, FIGS. 13A, 14A and 15 each illustrate a serial/parallel conversion circuit. These will be described below.

Modification 1

Figure 13A:
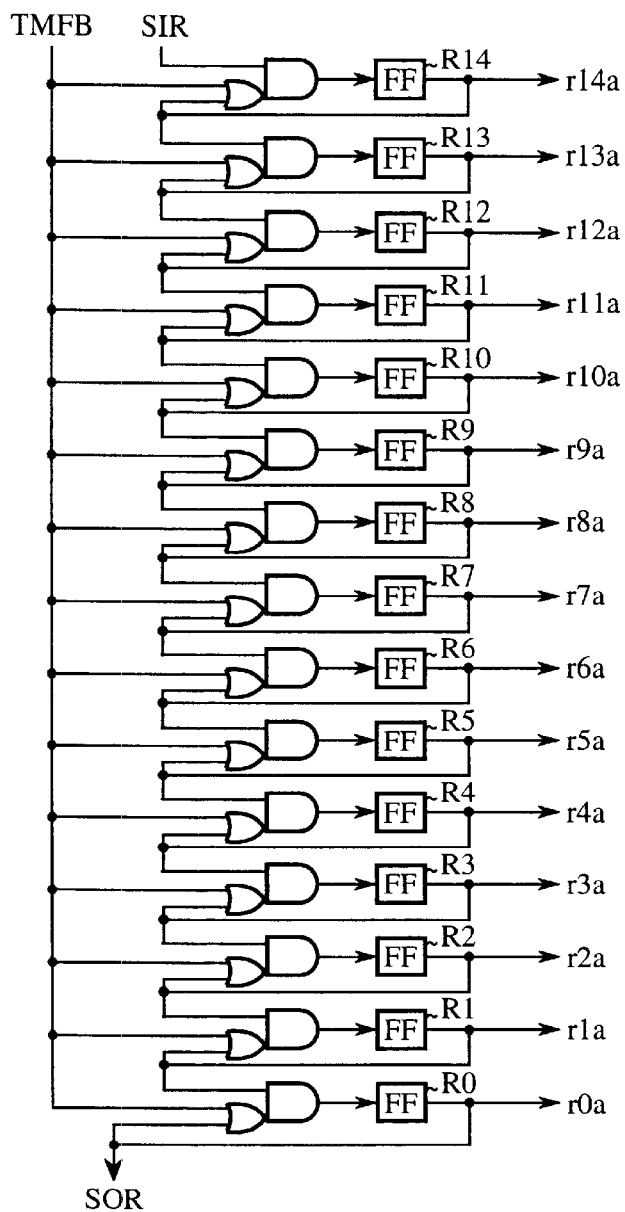
FIGS. 13A and 13B each are a detailed circuit diagram of a serial/parallel conversion circuit in accordance with a modification 1 of the present invention.

FIG. 13A is a circuit diagram of a semiconductor integrated circuit device in accordance with a modification 1 of the present invention. In FIG. 13A, reference numerals R0–R14 each designate a flip-flop (FF), and the other numerals or symbols are the same as those described above and these explanation-will be omitted.

Next, the operation will be described below.

First, a simple shift operation can be performed when TBFB=1 in TMFB terminal. Assuming that {r14a, r13a, r12a, r11a, r10a, r9a, r8a, r7a, r6a, r5a, r4a, r3a, r2a, r1a}={1, 0, 1, 1, 1, 1, 1, 1, 1, 1, 1, 1, 1, 1, 1} is set in this shift operation, the input signals of TMFB and SIR terminals are then set to TBFB=0 and SIR=1, and clocks are continuously supplied to the R0–R14 of the flip-flops (FF) while the input signals of TMFB and SIR terminals are respectively set to TMFB=0 and SIR=1, finally resulting in {r14a, r13a, r12a, r11a, r10a, r9a, r8a, r7a, r6a, r5a, r4a, r3a, r2a, r1a}={1, 0, 0, 0, 0, 0, 0, 0, 0, 0, 0, 0, 0, 0, 0}.

Accordingly, for example, the switches SW0–SW14 in FIG. 7 (or FIG. 8) can be directly controlled by use of such signals. In such a way, the AND circuits connected in series are not required.

Figure 13B:
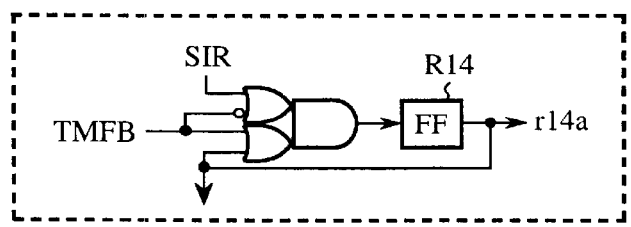

Here, when the front bit (bit number: 14, in FIG. 13A) is changed to the circuit configuration of FIG. 13B, the setting of SIR=1 is not required when the signal input is TMFB=0.

Modification 2

Figure 14A:
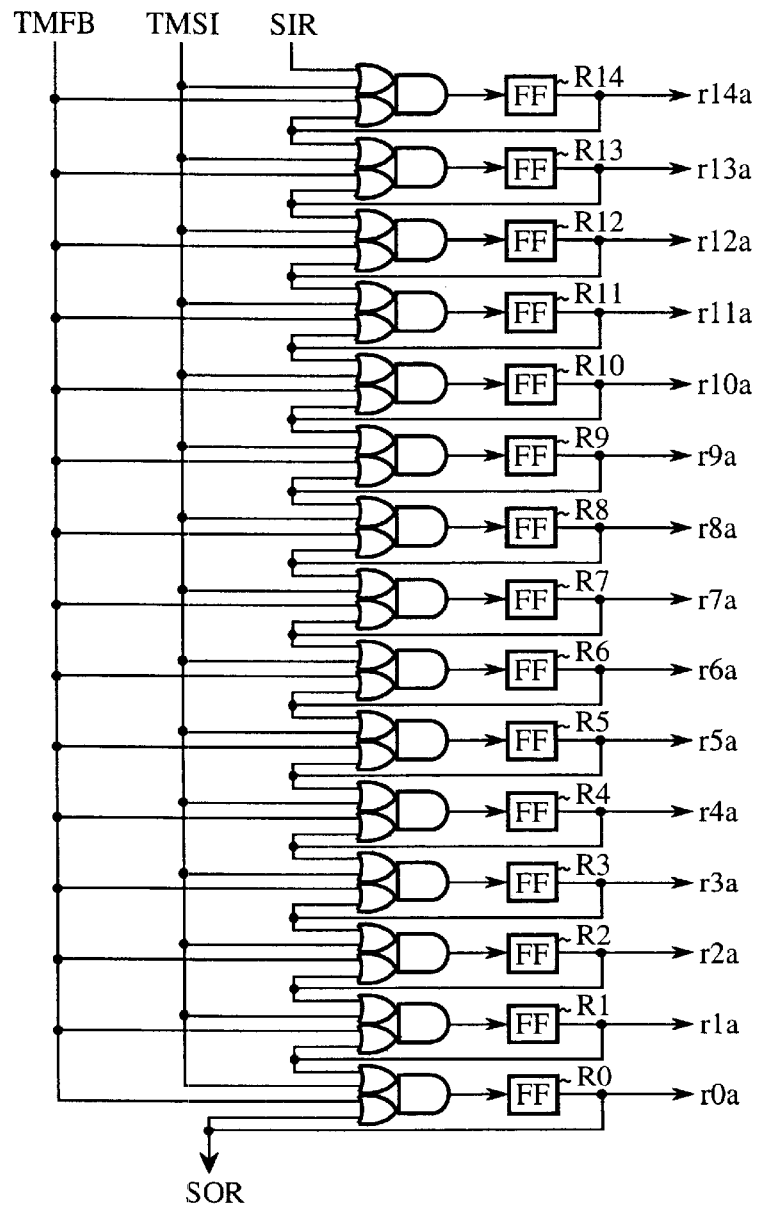
FIGS. 14A and 14B each are a detailed circuit diagram of a serial/parallel conversion circuit in accordance with a modification 2 of the present invention.
Figure 14B:
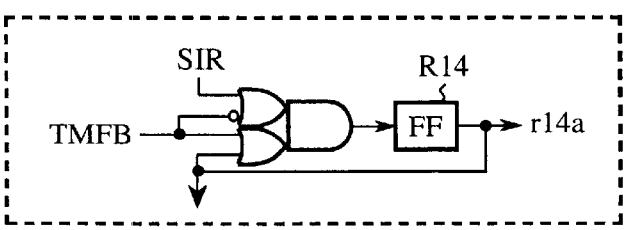

FIG. 14A is a circuit diagram of a semiconductor integrated circuit device in accordance with a modification 2, and FIG. 14B is a circuit diagram illustrating a modification of the front bit. FIG. 14A is the same circuit configuration as FIG. 13A except that TMSI input terminal is added and connected to each AND function.

Next, the operation will be described below.

First, a simple shift operation can be performed when TBFB=1 and TMSI=0 in TMFB and TMSI terminals. Assuming that {r14a, r13a, r12a, r11a, r10a, r9a, r8a, r7a, r6a, r5a, r4a, r3a, r2a, r1a, r0a}={1, 0, 1, 1, 1, 1, 1, 1, 1, 1, 1, 1, 1, 1, 1} is set in this shift operation, the input signals of TMFB, TMSI and SIR terminals are then set to TBFB=0, TMSI=0, and SIR=1, and clocks are continuously supplied to the R0–R14 of the flip-flops (FF) while the three input signals of TMFB, TMSI and SIR terminals are respectively set to TMFB=0, TMSI=0, and SIR=1, finally resulting in {r14a, r13a, r12a, r11a, r10a, r9a, r8a, r7a, r6a, r5a, r4a, r3a, r2a, r1a, r0a}={1, 0, 0, 0, 0, 0, 0, 0, 0, 0, 0, 0, 0, 0, 0}.

Accordingly, for example, the switches SW0–SW14 in FIG. 7 (or FIG. 9) can be directly controlled by use of such signals. In such a way, the AND circuits connected in series are not required. Here, when the front bit (bit number: 14, in FIG. 13A) is changed to the circuit configuration of FIG. 14B, the setting of SIR=1 is not required when the signal input is TMFB=0.

In the circuit configuration of FIG. 14A, since a feed-back route to each flip-flop itself can be constituted when the signal inputs are set to TMFB=0 and TMSI=1, the data can be held even if clocks are supplied in this condition. As compared to this, it is required to stop the clocks in order to hold the data in the circuit configuration of FIG. 13.

Modification 3

Figure 15:
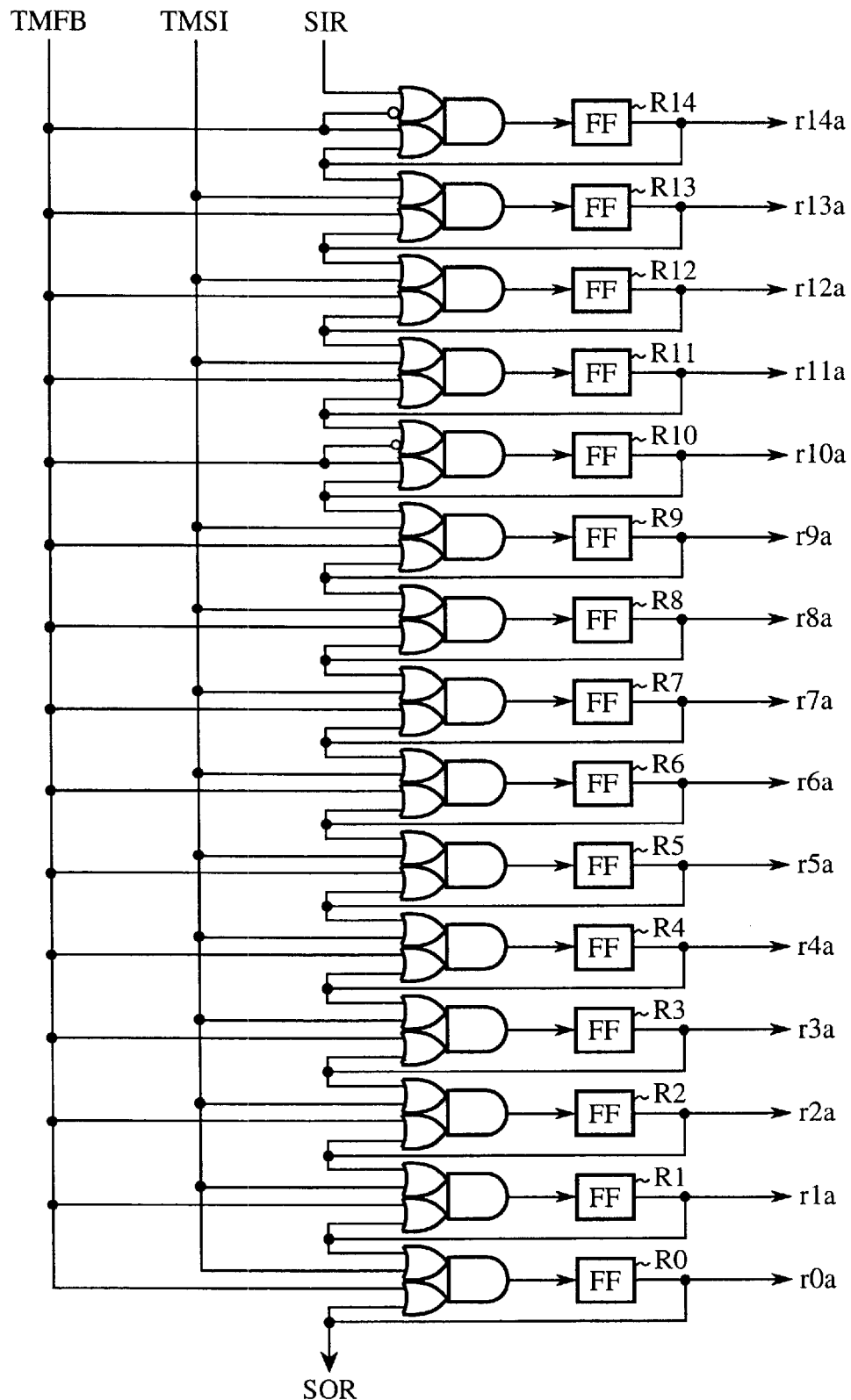
FIG. 15 is a detailed circuit diagram of a serial/parallel conversion circuit in accordance with a modification 3 of the present invention.

FIG. 15 is a circuit diagram of a semiconductor integrated circuit device in accordance with a modification 3 of the present invention, and is the same circuit configuration as that of the modification 2 except that a compound gate connecting to a flip-flop R14 is given by the circuit diagram of FIG. 14B.

Next, the operation will be described below.

A simple shift operation can be also performed when TBFB=1 and TMSI=0 in the signal inputs of TMFB and TMSI terminals. Assuming that {r14a, r13a, r12a, r11a, r10a, r9a, r8a, r7a, r6a, r5a, r4a, r3a, r2a, r1a, r0a}={1, 0, 1, 1, 1, 1, 1, 1, 1, 1, 1, 1, 1, 1, 1} is set in this shift operation, the input signals of TMFB a nd TMSI terminals are then set to TBFB=0 and TMSI=0, and clocks are continuously supplied to the R0–R14 of the flip-flops (FF) while the three input signals of TMFB, TMSI and SIR terminals are respectively set to TMFB=0, TMSI=0, and SIR=1, finally resulting in {r14a, r13a, r12a, r11a, r10a, r9a, r8a, r7a, r6a, r5a, r4a, r3a, r2a, r1a, r0a}={1, 0, 0, 0, 1, 1, 1, 1, 1, 1, 1, 1, 1, 1, 1}.

Accordingly, for example, the switches SW0–SW14 in FIG. 8 can be directly controlled by use of such signals. In such a way, the AND circuits connected in series are unnecessary.

Figure 16A:
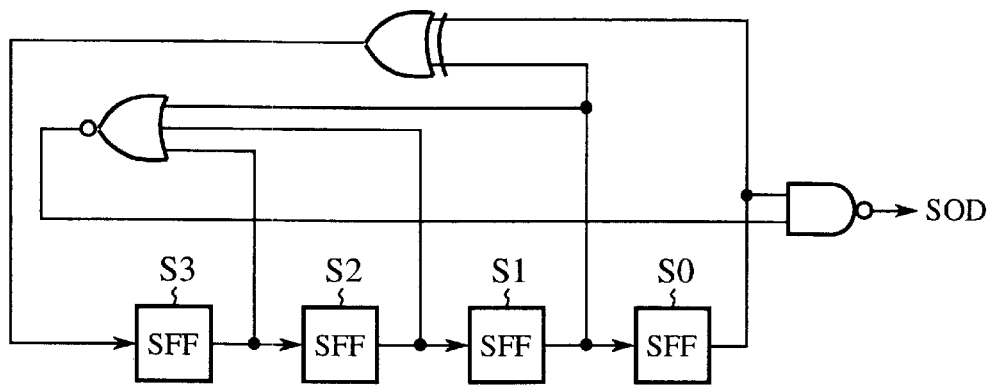
FIGS. 16A–16C each are a detailed circuit diagram of a serial/parallel conversion circuit in accordance with another modification of the present invention.
Figure 16B:
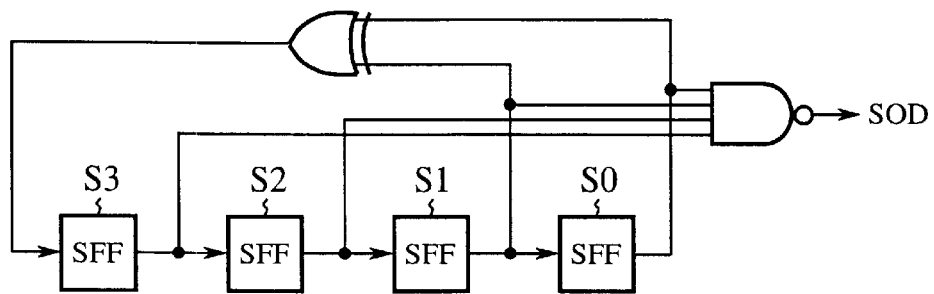
Figure 16C:
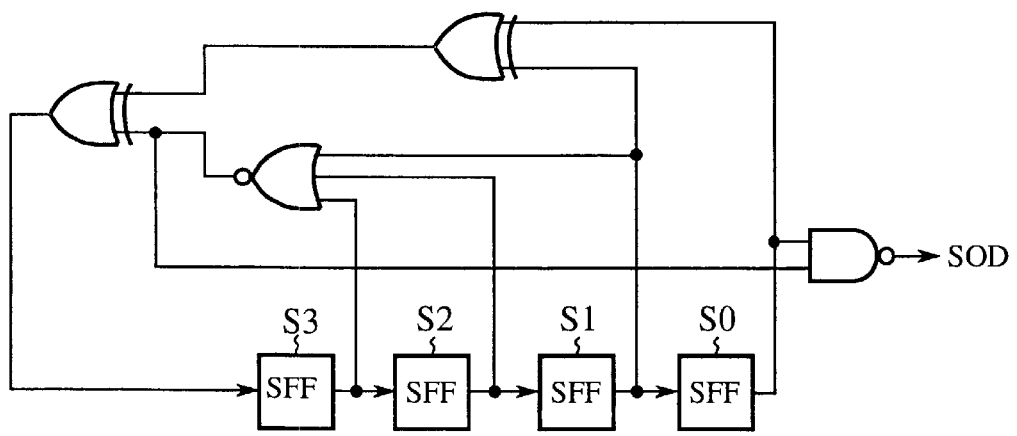

Note that in FIGS. 6, 9, and 11, the decode function is achieved by the circuit as shown in FIG. 16A, and may be changed to the circuits as shown in FIGS. 16B and 16C.

That is, in FIG. 16B, when the state of "0" in all the SFFs is detected, SOD output is SOD=0. On the other hand, in FIG. 16C, an EOR circuit is added to the circuit of FIG. 16A to modify the LFSR, thus enabling the count operation of 16 states including a state of S3=0, S2=0, S1=0, S0=0 in the scan flip-flops (SFF).

In the circuit of FIG. 16A, a state of S3=1, S2=0, S1=0, S0=0 is transferred to a state of S3=1, S2=0, S1=0, S0=0 in the scan flip-flops (SFF), and in the circuit of FIG. 16B, a state of S3=0, S2=0, S1=0, S0=0 is inserted therebetween.

A binary counter may be employed instead of the LFSR type counter as described in the embodiment 6; though the fuse element is shown as a program element, it may be substituted by a memory element such as non-volatile memory. Further, though the RAM is shown as a circuit to be controlled, which is a control object, it may be substituted by a FIFO memory and an analog circuit.

FIGS. 9 and 11 illustrate to constitute a counter with all the information bits (4 bits, in the example) but all the bits need not be used. For example, it is also possible to constitute a plurality of LFSRs by dividing the information bits. This case also allows to include a plurality of circuits that detect a specific state of each LFSR to output a SOD signal. This configuration can be substituted for a plurality of sets of a fuse element group (FUSEG), a fuse state detection circuit (FDG), and a parallel/serial conversion circuit (PSCONV).

Alternatively, it is also possible to mix a variety of circuit configurations on a simple semiconductor integrated circuit device as shown in FIGS. 1, 10, and 17.

What is claimed is:

1. A semiconductor integrated circuit device comprising:

a plurality of circuits to be controlled;

a plurality of program elements;

a program state detection circuit group for converting program states of said program elements to a plurality of logic signals;

a parallel/serial conversion circuit for converting the logic signals outputted from said program state detection circuit group to serial data; and one or a plurality of serial/parallel conversion circuits for receiving and supplying said serial data.

2. The semiconductor integrated circuit device according to claim 1, wherein said parallel/serial conversion circuit includes a CRC error correction circuit.

3. The semiconductor integrated circuit device according to claim 1, wherein said parallel/serial conversion circuit includes a counter circuit capable of setting part of all of parallel input data as a primary value; and a specific state detection circuit for detecting a specific state of said counter circuit, thereby transmitting the output of said specific state detection circuit to said serial/parallel conversion circuit as serial data.

4. The semiconductor integrated circuit device according to claim 1, wherein said program element is a fuse element to be blown.

5. The semiconductor integrated circuit device according to claim 1, wherein one of said circuits to be controlled is a memory circuit having a redundancy memory cell array.

6. The semiconductor integrated circuit device according to claim 1, wherein one of said circuits to be controlled is a power supply circuit.

7. The semiconductor integrated circuit device according to claim 1, wherein one of said circuits to be controlled is a timing generation circuit.

* * * * *